(12) United States Patent
Sen et al.

(10) Patent No.: US 8,358,169 B2
(45) Date of Patent: Jan. 22, 2013

(54) SYSTEMS AND METHODS FOR DISTORTION MEASUREMENT USING DISTORTION-TO-AMPLITUDE TRANSFORMATIONS

(75) Inventors: Shreyas Sen, Atlanta, GA (US); Shyam Kumar Devarakond, Atlanta, GA (US); Abhijit Chatterjee, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 260 days.

(21) Appl. No.: 12/917,386

(22) Filed: Nov. 1, 2010

(65) Prior Publication Data

US 2011/0102080 A1    May 5, 2011

Related U.S. Application Data

(60) Provisional application No. 61/256,547, filed on Oct. 30, 2009.

(51) Int. Cl.
*H03F 1/26* (2006.01)
(52) U.S. Cl. .......... 330/149; 330/2; 455/114.2; 375/296
(58) Field of Classification Search .................. 330/149, 330/2; 455/114.2; 375/296
See application file for complete search history.

(56) References Cited

U.S. PATENT DOCUMENTS

| | | | | |
|---|---|---|---|---|
| 6,396,345 | B2 * | 5/2002 | Dolman | 330/149 |
| 6,489,846 | B2 * | 12/2002 | Hatsugai | 330/149 |
| 6,512,417 | B2 * | 1/2003 | Booth et al. | 330/149 |
| 7,653,362 | B2 * | 1/2010 | Ahmed | 455/91 |
| 8,022,761 | B2 * | 9/2011 | Drogi et al. | 330/136 |
| 2008/0019433 | A1 * | 1/2008 | Yamanouchi et al. | 375/224 |
| 2009/0004981 | A1 * | 1/2009 | Eliezer et al. | 455/127.1 |

* cited by examiner

*Primary Examiner* — Patricia Nguyen
(74) *Attorney, Agent, or Firm* — Ryan A. Schneider, Esq.; Troutman Sanders LLP

(57) ABSTRACT

The presently invention is directed to ways to measure distortion effects while allowing for the possibility of significant reduction in test cost. An exemplary embodiment of the present invention provides a method for amplifier distortion measurement including comparing a first amplitude response of an output signal from a power amplifier to a second amplitude response of a reference input signal to determine a set of Amplitude-to-Amplitude ("AM-AM") distortion values. Additionally, the method for amplifier distortion measurement includes equalizing the first amplitude response of the output signal to match the second amplitude response of the reference input signal based on the set of AM-AM distortion values and creating a difference signal based on a comparison of the equalized output signal to the reference input signal. Furthermore, the method for amplifier distortion measurement includes calculating a set of Amplitude-to-Phase ("AM-PM") distortion values based on a third amplitude response of the difference signal.

20 Claims, 22 Drawing Sheets

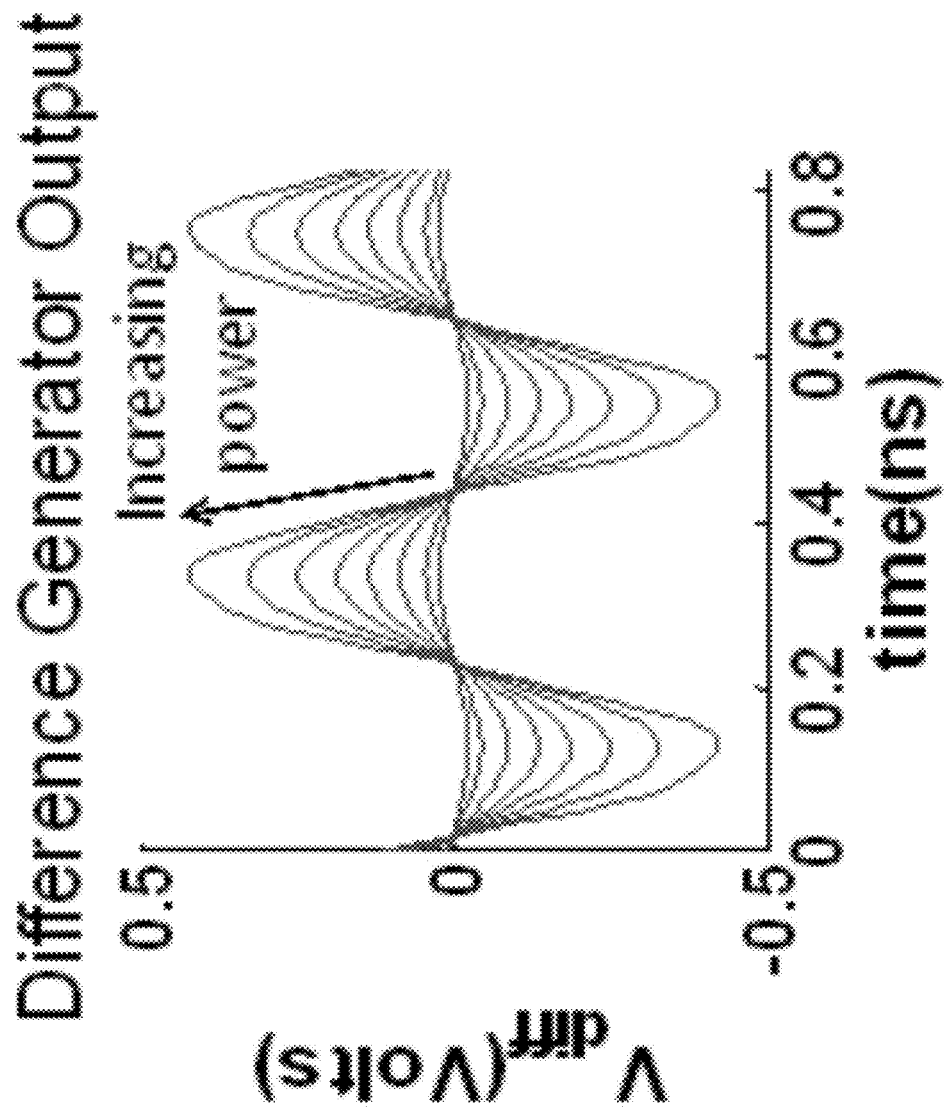

SYSTEMS AND METHODS FOR DISTORTION MEASUREMENT USING DISTORTION-TO-AMPLITUDE TRANSFORMATIONS

CROSS REFERENCE TO RELATED APPLICATION

This application claims the benefit of U.S. Provisional Patent Application No. 61/256,547, filed 30 Oct. 2009, the entire contents and substance of which are hereby incorporated by reference as if fully set forth below.

FIELD OF THE INVENTION

The present invention relates generally to systems and methods for amplifier distortion measurement.

BACKGROUND OF THE INVENTION

The increased demand for spectrally efficient wireless communication chips necessitates the use of high linearity RF (Radio Frequency) front ends. Among other things, the high power amplifier in the transmitter is a crucial element which determines the overall linearity of the transmitted RF signal. Power Amplifiers exhibit crucial distortion effects at high power, namely amplitude and phase distortions. These are characterized as amplitude to amplitude modulation (AM-AM) and amplitude to phase modulation (AM-PM). Moreover the increasing popularity of Orthogonal Frequency Division Multiplexing (OFDM) as the choice of modulation has increased the linearity requirements of these PAs significantly, making AM-AM and AM-PM even more critical.

AM-AM distortion or gain compression causes intermodulation distortion (IMD) resulting in the folding of the out of band signal onto the desired signal spectrum, thereby resulting in higher bit error rate. AM-PM distortion or phase distortion causes unequal rotation in the received constellation causing difficulties in signal detection. The sum effect of AM-AM and AM-PM causes bit errors at the received signal as well as out of hand interference in the transmitted signal leading to violation of the defined FCC transmit spectral mask.

There have been a number of techniques which deal with modeling and compensation of AM-AM and AM-PM effects. These range from simple polynomial based models to complex models based on volterra series to model memory effects in PAs. Amplitude distortion effects (AM-AM) are considerably less challenging to measure. Among other techniques, a simple technique such as placing a power detector at the PA output and measuring the output power level while sweeping the power of the input sine test signal can be used to measure gain compression. However accurate measurements of AM-PM effects require high precision instrumentation, and hence, are expensive and time consuming. A common form of measuring AM-PM is using a Vector Network Analyzer (VNA). The measured phase of S2I parameter in the swept power S parameter measurement provides the AM-PM information of the amplifier. Besides cost and time (setup time and calibration time) considerations in this particular setup, the measurement is highly sensitive to calibration.

Hence, low cost test method for measuring AM-AM and AM-PM is desired for production testing solutions.

BRIEF SUMMARY OF THE INVENTION

The presently invention is directed to systems and methods to accurately measure distortion effects while allowing for the possibility of significant reduction in test cost. An exemplary embodiment of the present invention provides a method for amplifier distortion measurement including comparing a first amplitude response of an output signal from a power amplifier to a second amplitude response of a reference input signal to determine a set of Amplitude-to-Amplitude ("AM-AM") distortion values. Additionally, the method for amplifier distortion measurement includes equalizing the first amplitude response of the output signal to match the second amplitude response of the reference input signal based on the set of AM-AM distortion values and creating a difference signal based on a comparison of the equalized output signal to the reference input signal. Furthermore, the method for amplifier distortion measurement includes calculating a set of Amplitude-to-Phase ("AM-PM") distortion values based on a third amplitude response of the difference signal.

In addition to methods for amplifier distortion measurement, the present invention provides amplifier distortion measurement systems. An exemplary embodiment of the amplifier distortion measurement system provides a power amplifier receiving a reference input signal and providing an output signal and a power detector in communication with an output of the power amplifier enabled to create a set of Amplitude-to-Amplitude ("AM-AM") distortion values based on the difference between the output signal and the reference input signal. Furthermore, the amplifier distortion measurement system provides a control module enabled to drive a variable attenuator in communication with an output of the power amplifier to create a equalized output signal to match the second amplitude response of the reference input signal based on the set of AM-AM distortion values. Additionally, the amplifier distortion measurement system provides a difference generator enabled to create a difference signal based on a comparison of the equalized output signal to the reference input signal, and a peak detector enabled to calculate a set of Amplitude-to-Phase ("AM-PM") distortion values based on a third amplitude response of the difference signal.

These and other objects, features and advantages of the present invention will become more apparent upon reading the following specification in conjunction with the accompanying drawing figures.

BRIEF DESCRIPTION OF THE FIGURES

FIGS. 6b illustrates the output of the difference generator 216, $V_{diff}$, for increasing input power levels in an exemplary embodiment of the amplifier distortion measurement system 200.

DETAILED DESCRIPTION OF PREFERRED EMBODIMENTS

Figure 1A:
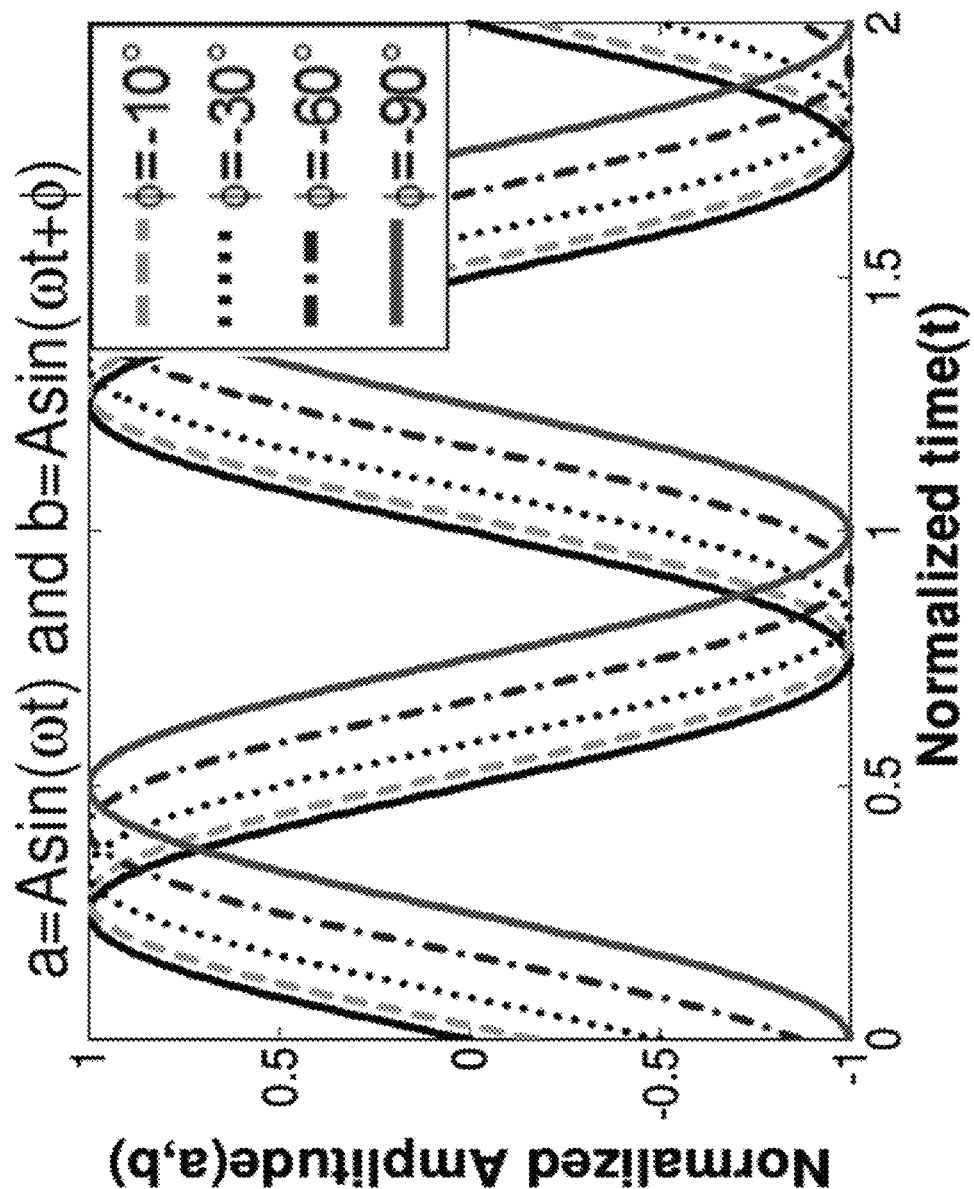
FIG. 1a shows a sine wave with zero phase and four other sine waves with increasing phase shift (θ=−10, −30, −60 and −90).

The present invention addresses the deficiencies in the prior art concerning the lack of a relatively low cost device or system to accurately measure amplitude and phase distortion in an amplifier. Significantly, the present invention provides methods and apparatus for providing cost efficient and effective amplifier distortion measurement systems using phase-to-amplitude conversion techniques. An amplifier distortion measurement system provided in accordance with the present invention is enabled to provide accurate measure of amplitude distortion and phase distortion with relatively simple hardware and/or software components compared to traditional network analyzers. Additionally, the present invention overcomes the drawbacks of the conventional methods and systems in the prior art and provides some embodiments of the systems and methods, which are enabled to utilize software and minimal hardware to calculate amplitude distortion and phase distortion in real-time.

An exemplary embodiment of the present invention provides a method for amplifier distortion measurement including comparing a first amplitude response of an output signal from a power amplifier to a second amplitude response of a reference input signal to determine a set of Amplitude-to-Amplitude ("AM-AM") distortion values. Additionally, the method for amplifier distortion measurement includes equalizing the first amplitude response of the output signal to match the second amplitude response of the reference input signal based on the set of AM-AM distortion values and creating a difference signal based on a comparison of the equalized output signal to the reference input signal. Furthermore, the method for amplifier distortion measurement includes calculating a set of Amplitude-to-Phase ("AM-PM") distortion values based on a third amplitude response of the difference signal.

In addition to methods for amplifier distortion measurement, the present invention provides amplifier distortion measurement systems. An exemplary embodiment of the amplifier distortion measurement system provides a power amplifier receiving a reference input signal and providing an output signal and a power detector in communication with an output of the power amplifier enabled to create a set of Amplitude-to-Amplitude ("AM-AM") distortion values based on the difference between the output signal and the reference input signal. Furthermore, the amplifier distortion measurement system provides a control module enabled to drive a variable attenuator in communication with an output of the power amplifier to create a equalized output signal to match the second amplitude response of the reference input signal based on the set of AM-AM distortion values. Additionally, the amplifier distortion measurement system provides a difference generator enabled to create a difference signal based on a comparison of the equalized output signal to the reference input signal, and a peak detector enabled to calculate a set of Amplitude-to-Phase ("AM-PM") distortion values based on a third amplitude response of the difference signal.

An amplifier distortion measurement system in accordance with an exemplary embodiment of the present invention can reduce the costs of testing Amplitude-to-Amplitude ("AM-AM") distortion and Amplitude-to-Phase ("AM-PM") distortion while maintaining or increasing the accuracy of the measurement over prior art methods and systems. In an exemplary embodiment, the amplifier distortion measurement system includes a test circuit in conjunction with hardware and/or software based difference generation and peak detection systems. An exemplary embodiment of the amplifier distortion measurement system provides highly accurate distortion measurement without the complex and expensive hardware of a traditional network analyzer, such as a Vector Network Analyzer ("VNA").

One of the significant advancements provided by the present invention is that it enables phase distortion to be calculated as a function of signal amplitude analysis. Phase deviation and distortion analysis is a complicated task that has traditionally required a complex instrument such as a VNA. An exemplary embodiment of the amplifier distortion measurement system in accordance with the present invention can calculate AM-PM distortion without engaging in a direct phase analysis of transmission signal. The present invention relies upon a phase-to-amplitude conversion process. Specifically, the present invention relies upon a key observation that the difference of two sine waves with identical amplitude and frequency but different phase is another sine wave with the same frequency whose amplitude is proportional to the phase difference of the two sine waves. Therefore, an exemplary embodiment of the amplifier distortion measurement system can convert the phase difference between two signals of the same frequency to amplitude and detect phase deviation and distortion through relatively low cost test techniques of amplitude analysis rather than complicated phase analysis.

Those of skill in the art will appreciate that the methods and systems of distortion measurement disclosed herein can be used to measure distortion exhibited by a wide variety of amplifiers in a wide variety of implementations. For example, and not limitation, the methods and systems of distortion measurement disclosed herein can be used on a power amplifier in wireless transmission systems, such as mobile phone, cellular base station, WiFi router, or other wireless transmission device. Additionally, the methods and systems of distortion measurement disclosed herein can be used on wireline amplifiers and optical amplifiers.

RF Power Amplifiers ("PA"s) are large signal devices that exhibit non linear effects with increasing input power. The performance of an RF Power Amplifier can be quantified by its gain, phase deviation, 1-dB compression point, AM-AM distortion, and AM-to-PM distortion.

Power Gain can be described as the ratio of the output power delivered to the load of the power amplifier to the power available at the source of the amplifier. Phase deviation can be described as the constant phase difference between the output of the PA and the input of PA due to the delay added by the PA circuitry. With regards to gain compression, with increasing input power levels, the output power is progressively compressed, and hence, output power fails to increase linearly with input power. This reduction in gain is known as gain compression and is characterized by the 1 dB compression point (P1 dB) of the amplifier, or, in other words, the output power level for which the gain reduces by 1 dB from its small signal value.

AM-AM distortion can define the manner in which the amplitude of the PA output is affected by gain compression of the power amplifier input-output transfer function at high output power levels. AM-PM distortion can define the manner in which the phase of the output signal at a particular frequency is affected by nonidealities in the power amplifier input-output transfer function in relation to the phase of the signal at the same frequency that is input to the device.

AM-AM distortion can be defined as the change in gain per dB increase of input power and characterized by dB/dB. Similarly AM-PM can be defined as the phase change per dB increase of input power and is expressed in degrees/dB.

The above PA performance characteristics are typically determined from gain and phase deviation measurements obtained by sweeping the PA input power across a range of values. The conventional form of this measurement is performed using a VNA and can be performed by calibrating the VNA for the measurement setup, measuring the gain vs. input power, and then measuring the phase deviation vs. input power. An exemplary embodiment of the amplifier distortion measurement system provided by the present invention can, however, calculate the PA performance characteristics without direct phase deviation measure but rather with phase-to-amplitude conversion.

The phase-to-amplitude conversion performed by an exemplary embodiment of the amplifier distortion measurement system relies upon the key observation that the difference of two sine waves with identical amplitude and frequency but different phase is another sine wave with the same frequency whose amplitude is proportional to the phase difference of the two sine waves. The following derivation proves this key observation. Where $\omega$ is the frequency of the two sine waves, A is their amplitude, $\emptyset$ is the phase difference between them, and $V_{diff}$ is the difference between the two waveforms.

Assuming both are cosine waves we get:

$$V_{diff} = A\cos(\omega t) - A\cos(\omega t + \phi) \quad (1)$$
$$= A[\cos(\omega t) - \cos(\omega t)\cos(\phi) + \sin(\omega t)\sin(\phi)]$$
$$= A[\cos(\omega t)\{1 - \cos(\phi)\} + \sin(\omega t)\sin(\phi)]$$
$$= 2A\sin(\phi/2) \times \sin(\omega t + \phi/2)$$

Similarly for sine waves it can be shown that $$V_{diff} = A\sin(\omega t) - A\sin(\omega t + \phi) \quad (2)$$
$$= -2A\sin(\phi/2) \times \cos(\omega t + \phi/2)$$

In both the cases, it is found that $$|V_{diff}| = 2A\sin(\emptyset/2) \quad (3)$$

As illustrated by Equation (3), the amplitude of the difference of the two waves is dependent on the phase difference of the original waveforms, more accurately, is proportional to the sin( ) of half of the phase difference between them.

Figure 1B:
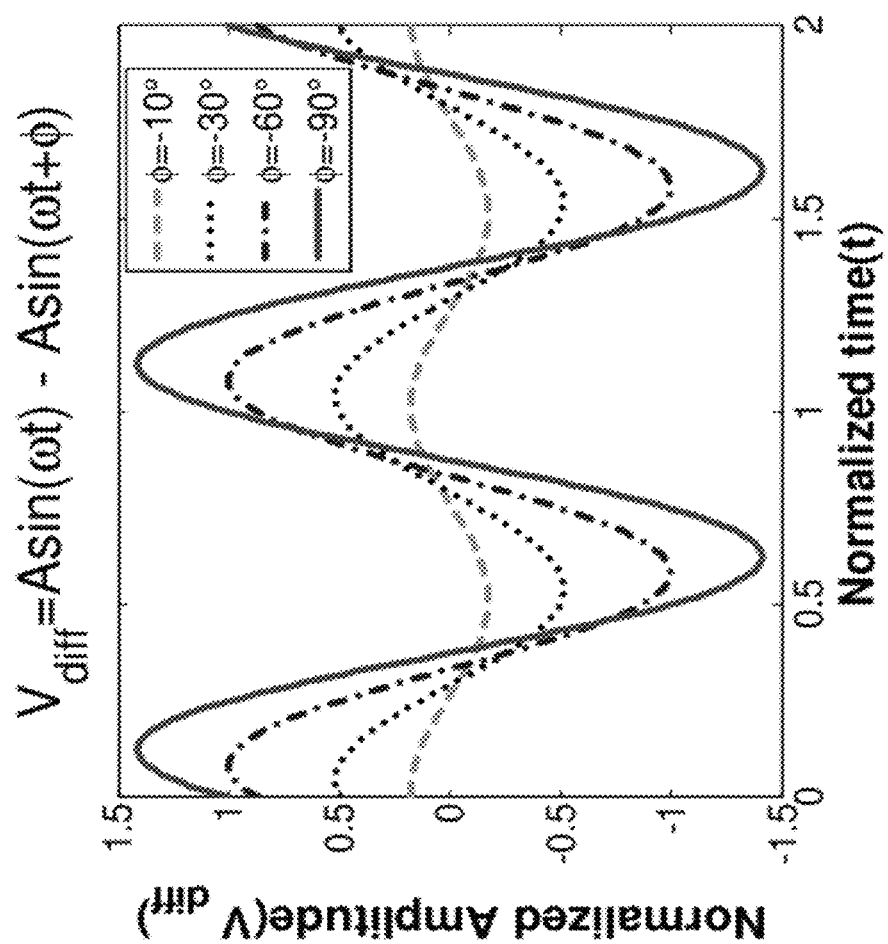
FIG. 1b shows the difference between the zero phase signal and the four signals with different phase values.

FIGS. 1a and 1b illustrate the relationship of Equation (3) in graphical form. FIG. 1a shows a sine wave with zero phase and four other sine waves with increasing phase shift ($\emptyset$=−10, −30, −60 and −90). FIG. 1b shows the difference between the zero phase signal and the four signals with different phase values. As derived in Equation (2), the difference between the waveforms is a cosine wave with same frequency, $\emptyset$/2 phase delay (evident from the delayed zero crossing) and an amplitude given by −2A sin($\emptyset$/2) (since $\emptyset$ is negative, this term is positive).

Traditional RF power amplifiers typically have a power detector (PD) at the output of the amplifier. An exemplary embodiment of the amplifier distortion measurement system relies on a PD for low-cost measurement of gain compression. Furthermore, an exemplary embodiment of the amplifier distortion measurement system calibrates the AM-AM distortion effect "out" of the AM-PM distortion measurement procedure. Then the AM-PM distortion can be mapped by an exemplary embodiment of the amplifier distortion measurement system into amplitude variations of a "difference" signal, as shown in FIG. 1b. In one embodiment, the amplifier distortion measurement system can measure the amplitude response of the "difference" signal using peak detection circuitry and software. In some embodiments, once the peak value of the "difference" signal is determined, the underlying AM-PM distortion of the RF PA device being tested may be readily calculated.

Figure 2A:
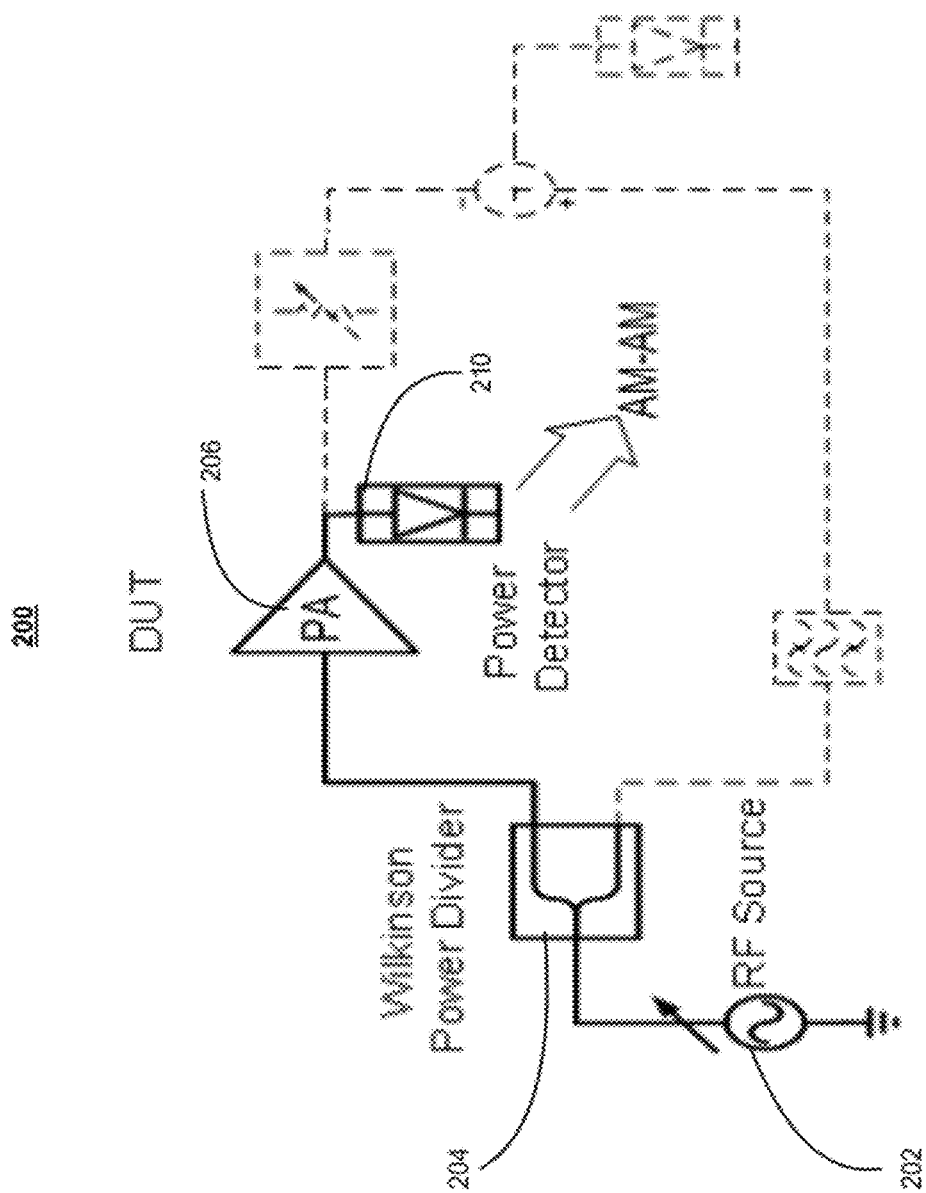
FIG. 2a provides an illustration of a portion of an amplifier distortion measurement system 200 in accordance with an exemplary embodiment of the present invention.
Figure 2B:
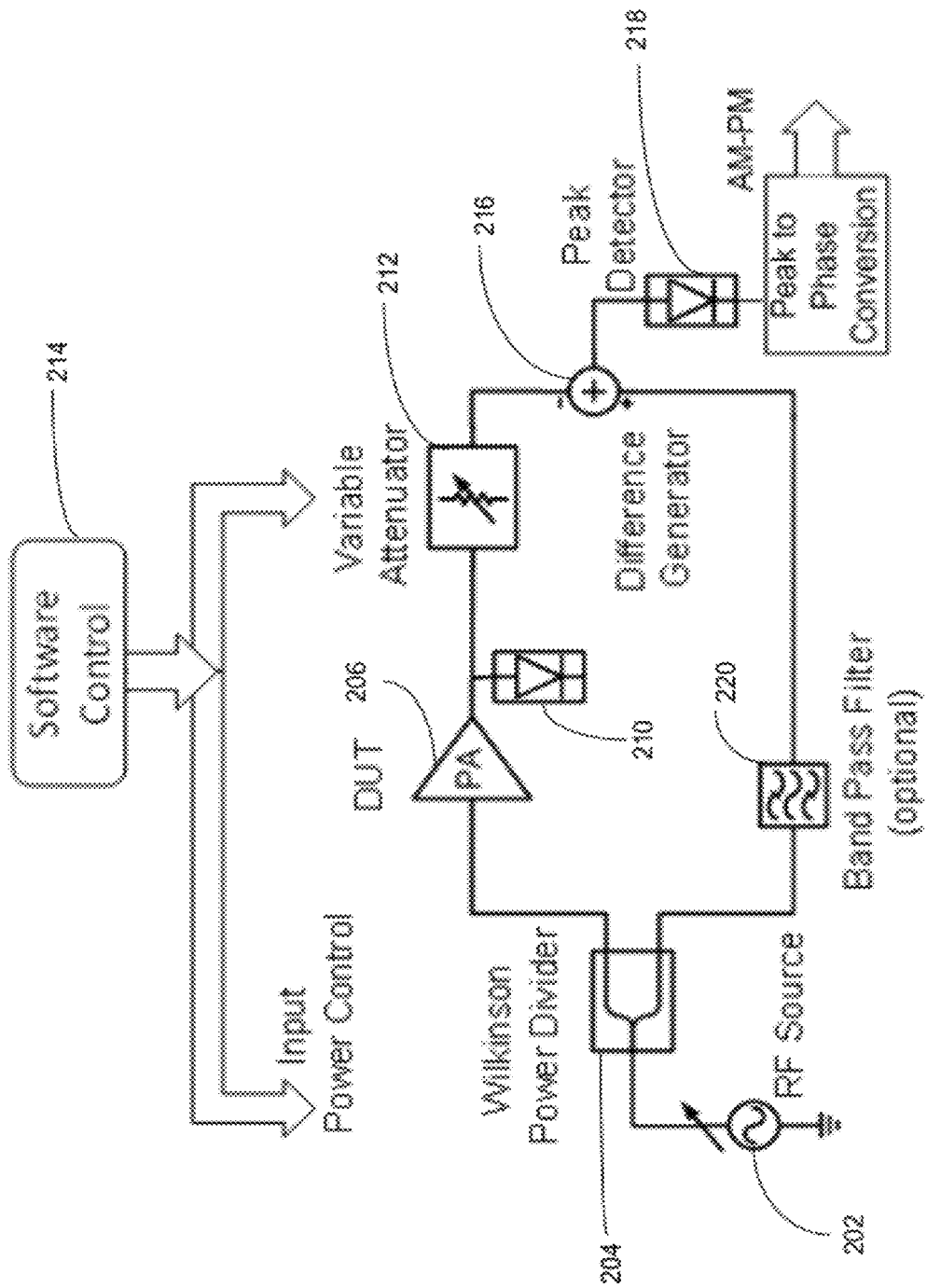
FIG. 2b provides an illustration of an amplifier distortion measurement system 200 in accordance with an exemplary embodiment of the present invention.

In accordance with an exemplary embodiment of the amplifier distortion measurement system, AM-AM distortion and AM-PM distortion measurements may be performed directly in the RF domain using an amplitude equalizer, such as a variable attenuator, and difference generator that performs phase-to-amplitude conversion. FIGS. 2a and 2b are exemplary and non-limiting system diagrams illustrating example systems that may be used according to the presently disclosed subject matter.

FIG. 2a provides an illustration of a portion of an amplifier distortion measurement system 200 in accordance with an exemplary embodiment of the present invention. The portion of the exemplary embodiment of the amplifier distortion measurement system shown in FIG. 2a illustrates the components used to calculate AM-AM distortion. The power detector 210 can be used to measure the gain and AM-AM distortion effects of the PA. As shown in FIG. 2a, a controllable output power RF signal source 202 can be used in an exemplary embodiment of the amplifier distortion measurement system to generate an RF sinusoidal input signal. A power divider 204, such as a Wilkinson Power Divider (WPD), can be used in an exemplary embodiment of the amplifier distortion measurement system to split the RF sinusoidal input signal into two signals with equal output power. One signal is used to drive RF PA 206 input and the other signal, the reference input signal, is used as a reference for distortion measurement. Those of skill in the art will appreciate that although the PA 206 is depicted inside the exemplary embodiment of the amplifier distortion measurement system 200 shown in FIG. 2a, it is not a component of the system 200 but rather the device for which AM-AM and AM-PM distortion is to be calculated. Furthermore, those of skill in the art will appreciate that the amplifier distortion measurement system 200 can be integrated with the PA 206 in some embodiments or provided as a separate stand alone testing device from the PA 206 in other embodiments.

The power detector 210 can be used to measure the PA output power across different input power levels. An exemplary embodiment of the amplifier distortion measurement system can measure the difference between the output signal from the PA 206 and the reference input signal and determine gain at lower power levels and gain compression, hence AM-AM distortion, at higher power levels. Therefore, the power detector 210 can be used by an exemplary embodiment of the amplifier distortion measurement system 200 to create a set of AM-AM distortion values for the output signal of the PA 206 at various input power levels.

FIG. 2b provides an illustration of an amplifier distortion measurement system 200 in accordance with an exemplary embodiment of the present invention. The reference input signal derived from the output of the power divider 204, in an exemplary embodiment of the amplifier distortion measurement system 200, is preferably as "clean" as possible. In an exemplary embodiment, the optional band pass filter 220 at the RF test frequency can be used for providing a clean reference input signal, as shown in FIG. 2b. Variable attenuator 212 can be implemented in an exemplary embodiment of the amplifier distortion measurement system 200 at the output of PA 206 to equalize the output signal from the PA 206 with the reference input signal; thereby, the variable attenuator 212 can create an equalized output signal. An exemplary embodiment of the amplifier distortion measurement system 200, provides a software control module 214. The software control module 214 in the exemplary embodiment of the amplifier distortion measurement system 200 can set the attenuation value for each input power value, as per the set of AM-AM distortion values measured by the power detector 210. In one embodiment in which case band pass filter 220 is used, band pass filter's 220 input-to-output power loss is accounted for in setting the attenuation values of the variable attenuator 212 so that the correct "difference" signal is produced at the output of the test setup. In an exemplary embodiment of the amplifier distortion measurement system 200, the variable attenuator 212 can rely upon the set of AM-AM distortion values to create an equalized output signal, in which the equalized output signal and the reference input signal are the same for all input power levels, thereby removing the AM-AM distortion effects.

An exemplary embodiment of the amplifier distortion measurement system 200 also provides a difference generator 216. In an exemplary embodiment of the amplifier distortion measurement system 200, the difference generator 216 produces a difference signal, as per Equation (1), $V_{diff}=A\cos(\omega t)-A\cos(\omega t+\varnothing)$. Finally, an exemplary embodiment of the amplifier distortion measurement system 200 can provide a peak detector 218 to measure the peak values of the difference signal, |Vdiff|, from which the phase shift Ø can be calculated using Equation (4) below:

$$\varnothing=\sin^{-1}(|V_{diff}|/2A) \qquad (4)$$

For |Vdiff| to be due to the phase shift introduced by AM-PM distortion of the PA 206 in an exemplary embodiment, both the output signal from the PA 206 and the reference input signal should have sufficiently the same amplitude response (amplitude values across input power range). Those of skill in the art will appreciate that the output signal and the reference input signal do not have to be identically matched in amplitude response, rather some embodiments may require a tighter tolerance in amplitude response matching than others, depending on the requirements for the amplifier distortion measurement system 200. If the amplitude response of the output signal of the PA 206 and the reference input signal are not sufficiently matched, the peak difference signal |Vdiff| will be a function of the amplitude mismatch between the two signals, and hence, phase distortion measurement can be inaccurate. In one embodiment, the software control module 214 can be configured to rely upon the set of AM-AM distortion values to operate the variable attenuator 212 to appropriately match the output signal amplitude response to the reference signal input amplitude response. The difference generator 215 in an exemplary embodiment of the amplifier distortion measurement system 200 can be linear across the range of signal power values provided by the reference input signal. In other embodiments, certain degrees of nonlinearity in difference generator 216 can be characterized and the test procedure can be calibrated to achieve correct phase distortion measurement.

Figure 3:
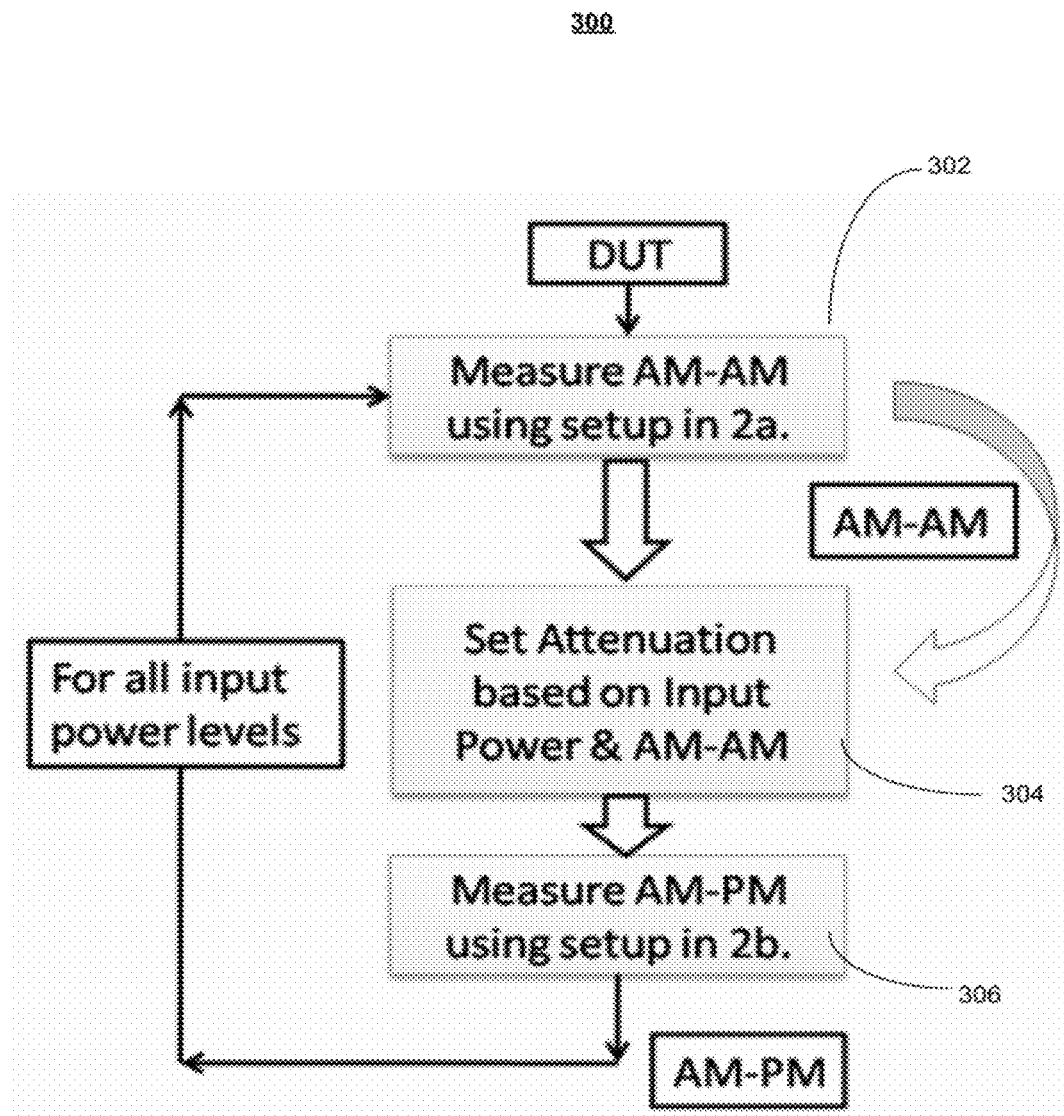
FIG. 3 provides an illustration of a block diagram of the method of amplifier distortion measurement 300 in accordance with an exemplary embodiment of the present invention.

FIG. 3 provides an illustration of a block diagram of the method of amplifier distortion measurement 300 in accordance with an exemplary embodiment of the present invention. In an exemplary embodiment of the method of amplifier distortion measurement 300, step 302 involves measuring the amplitude of the output signal from the PA 206 for a range of input power of interest. Step 302 further involves comparing the amplitude of the output signal to the amplitude of the reference input signal and determining a set of AM-AM distortion values. Additionally, an exemplary embodiment of the method of amplifier distortion measurement 300 involves step 304 of using the set of AM-AM distortion values from step 302 to set the attenuation value depending on the input power such that the amplitude of the reference input signal and the output signal from the PA 206 after attenuation are sufficiently similar. Therefore, step 304 preferably removes the AM-AM distortion effect from the output signal of the PA 206, yet the phase deviation remains in the output signal. The exemplary embodiment of the method of amplifier distortion measurement 300 further includes step 306, in which the difference generator 216 generates a sinusoid whose amplitude is dependent (by Equation (3)) on the phase difference of the output signal of PA 206. Using Equation (4), an exemplary embodiment of the method of amplifier distortion measurement 300 can provide a set of AM-PM distortion values. Accordingly, the exemplary embodiment of the method of amplifier distortion measurement 300 can effectively provide a set of accurate AM-AM distortion values and a set of accurate AM-PM distortion values.

Figure 4:
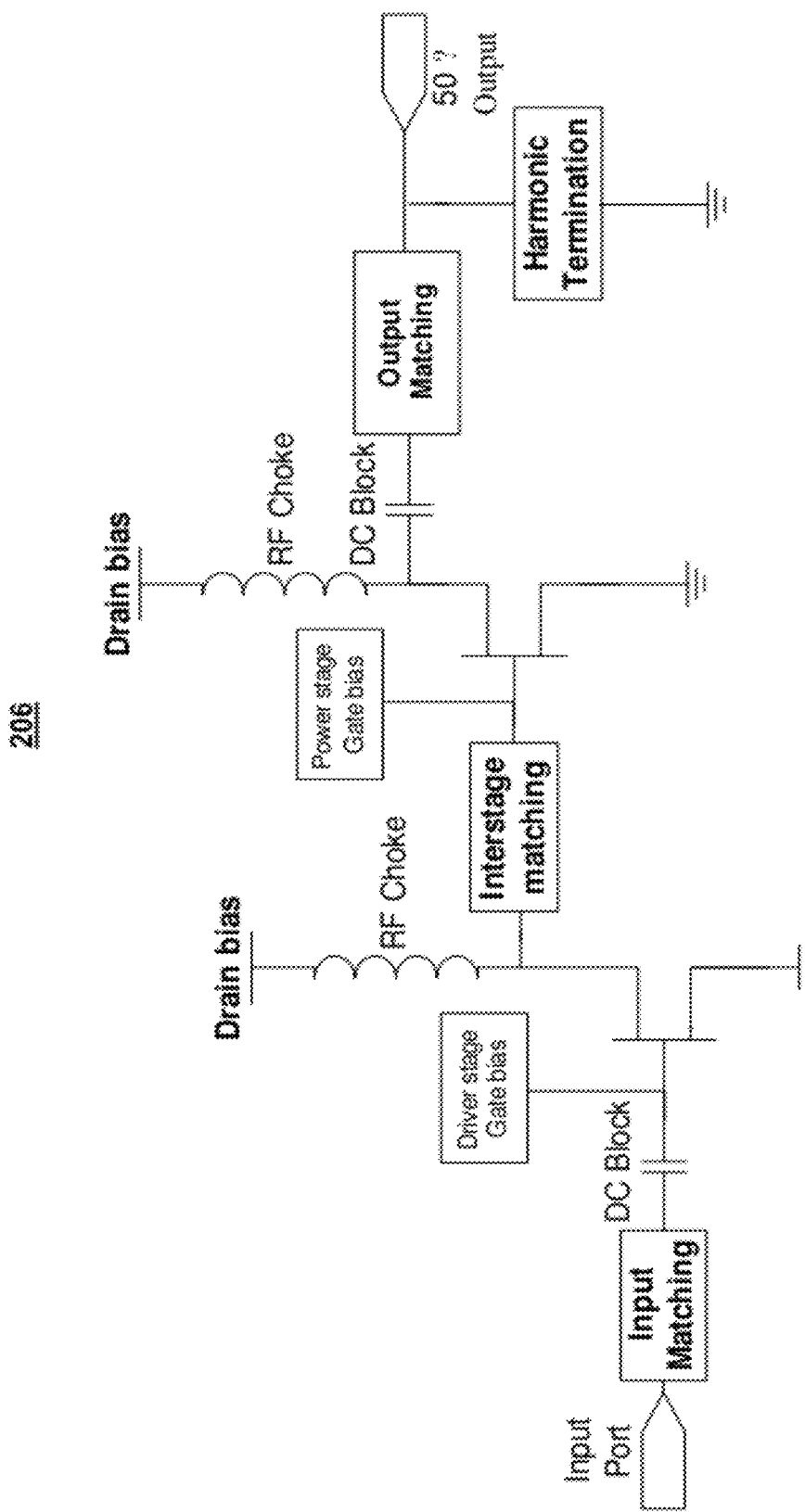
FIG. 4 provides an illustration of a PA 206 in accordance with an exemplary embodiment of the present invention.

FIG. 4 provides an illustration of a PA 206 in accordance with an exemplary embodiment of the present invention. FIG. 4 illustrates an exemplary embodiment of two stage PA 206 using CMOS 0.35u technology for simulation purposes. In this exemplary embodiment, input matching can be provided before the driver stage so that maximum power could be transferred from the signal source. The driver stage in this exemplary embodiment of the PA 206 is designed to provide a gain of 13 dB whereas the power stage is designed to deliver a gain of around 9 dB at 2.4 GHz. The driver stage and the power stage can be connected in this exemplary embodiment of the PA 206 through an interstage matching network of band pass type. Output matching is provided to match the output to 50 ohm in this exemplary embodiment of the PA 206. Furthermore, the exemplary embodiment of the PA 206 provides a harmonic termination network at the output to provide suppression at harmonic frequencies. The exemplary embodiment of the PA 206 shown FIG. 4 can be designed from a 3.3V supply to have a gain of 21 dB, output 1 dB compression point (P1 dB) of 26.92 dBm and Power Added Efficiency (PAE) greater than 40%. The exemplary embodiment of the PA 206 can be used for both the methods for simulation purposes as well as for process and temperature simulations. The input P1 dB of the PA is around 6 dBm (26.91−21=5.92).

FIGS. 5a-10 provide illustrative measurements of various embodiments amplifier distortion measurement system 200. These figures illustrate the step by step results for an exemplary embodiment of the method of amplifier distortion measurement 300. For the exemplary embodiment of the method of amplifier distortion measurement 300 used to generate the FIGS. 5a-10, an exemplary embodiment of the amplifier distortion measurement system 200 is used on a PA 206 with an input P1 dB of 6 dBm and the PA 206 has been characterized with an reference input power signal with a RF power sweep from −20 dBm to 10 dBm to cover both linear and compression region within a certain degree.

Figure 5A:
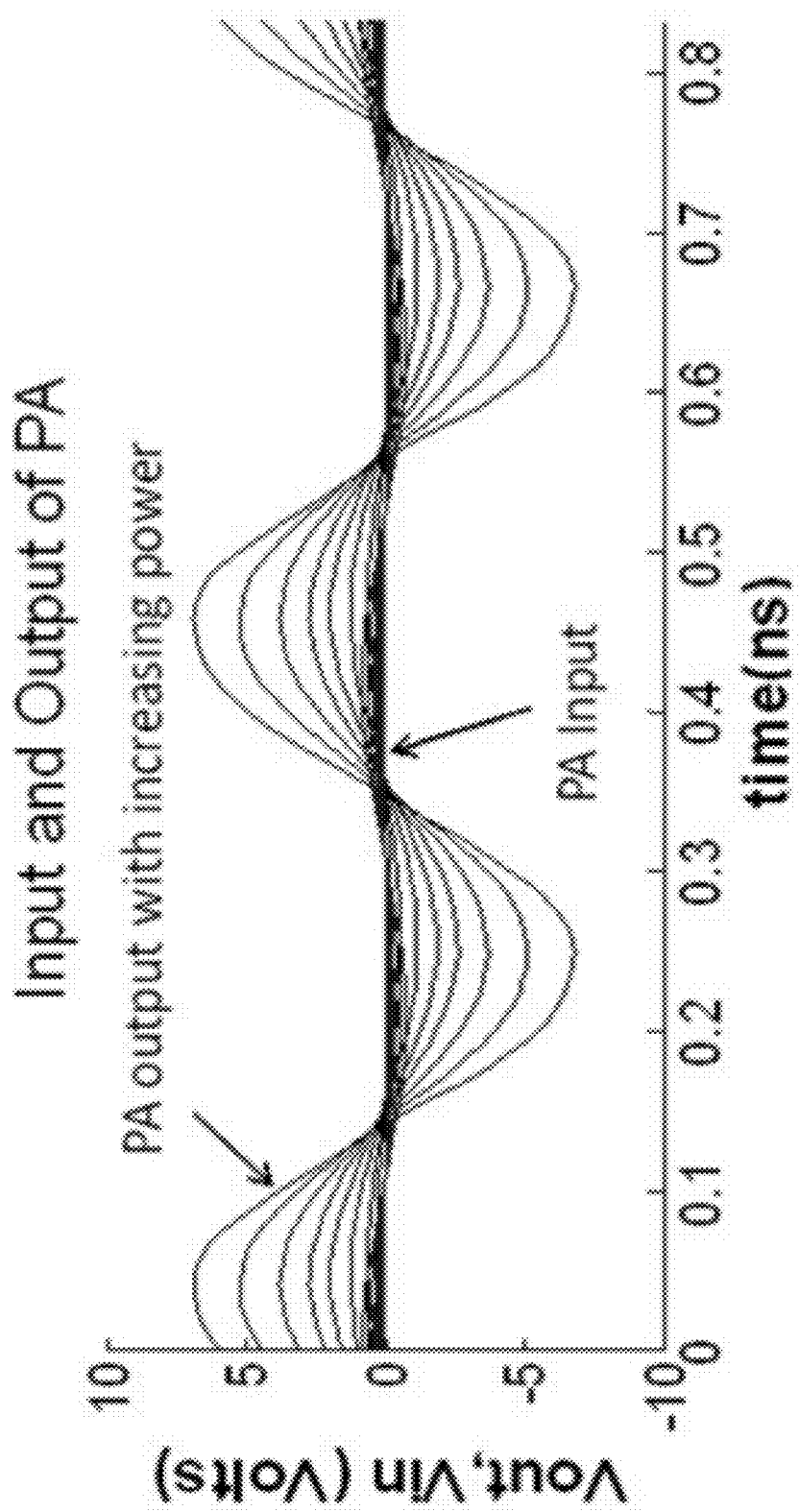
FIG. 5a shows the input reference signal and the output signal from PA 206 for different input power levels.
Figure 5B:
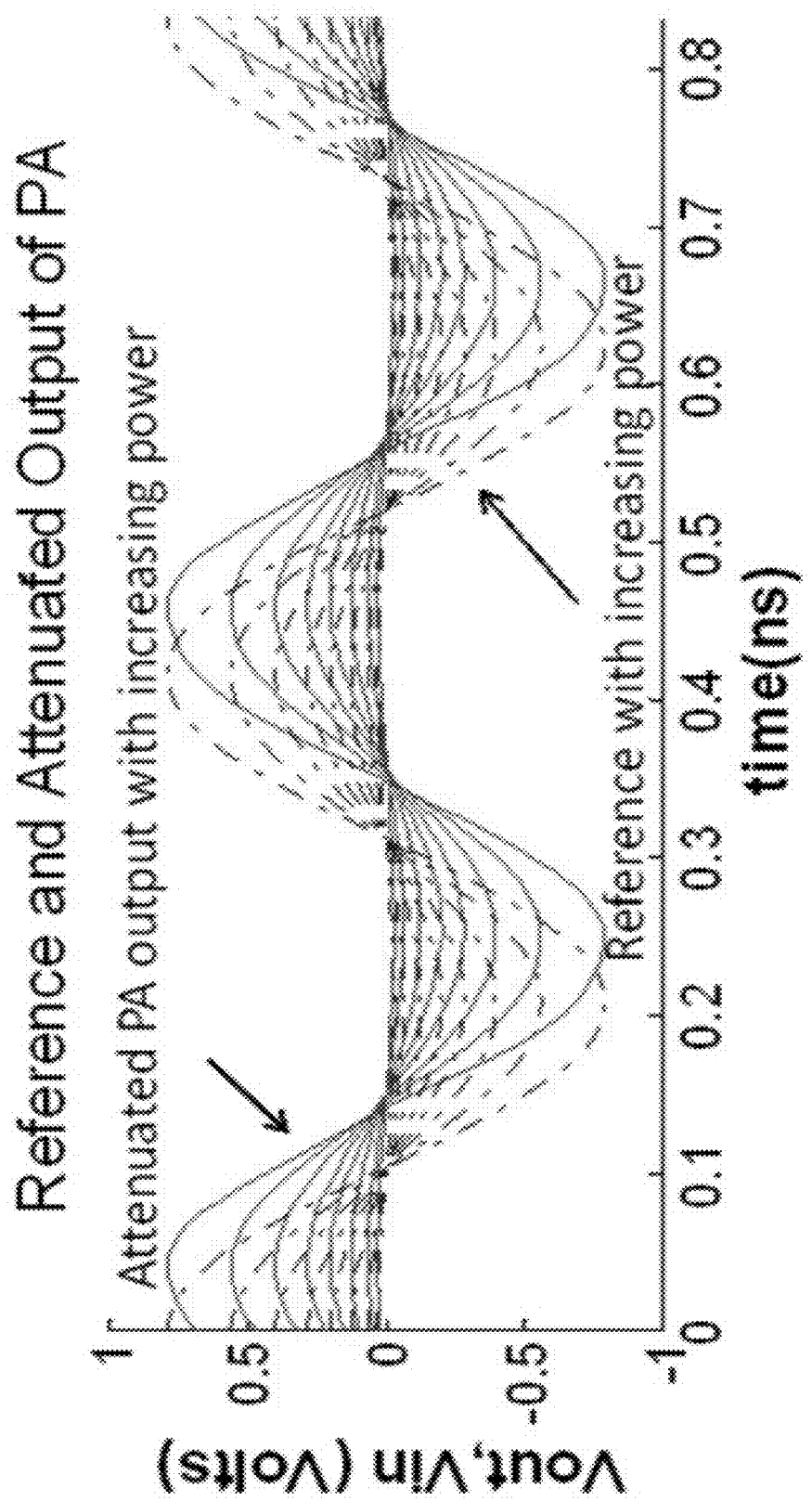
FIG. 5b illustrates how the exemplary embodiment of the amplifier distortion measurement system 200 can accurately remove the AM-AM distortion effects from the output signal.

FIG. 5a shows the input reference signal and the output signal from PA 206 for different input power levels. The difference in the power levels is due to the gain of PA 206. FIG. 5b shows the output of the equalized output signal from a variable attenuator 212 of an exemplary embodiment of the amplifier distortion measurement system 200 and the reference input signal for several input power levels. The graphs in FIG. 5b illustrate how the exemplary embodiment of the amplifier distortion measurement system 200 can accurately remove the AM-AM distortion effects from the output signal, such that the equalized output signal and the reference input signal have same amplitude for all the input power levels (amplitude response). If a constant attenuation (equal to the linear gain of the PA) were used in an exemplary embodiment of the amplifier distortion measurement system 200, then the output signal of the PA 206 would have been lesser in amplitude than the reference for higher input power due to gain compression.

Figure 6A:
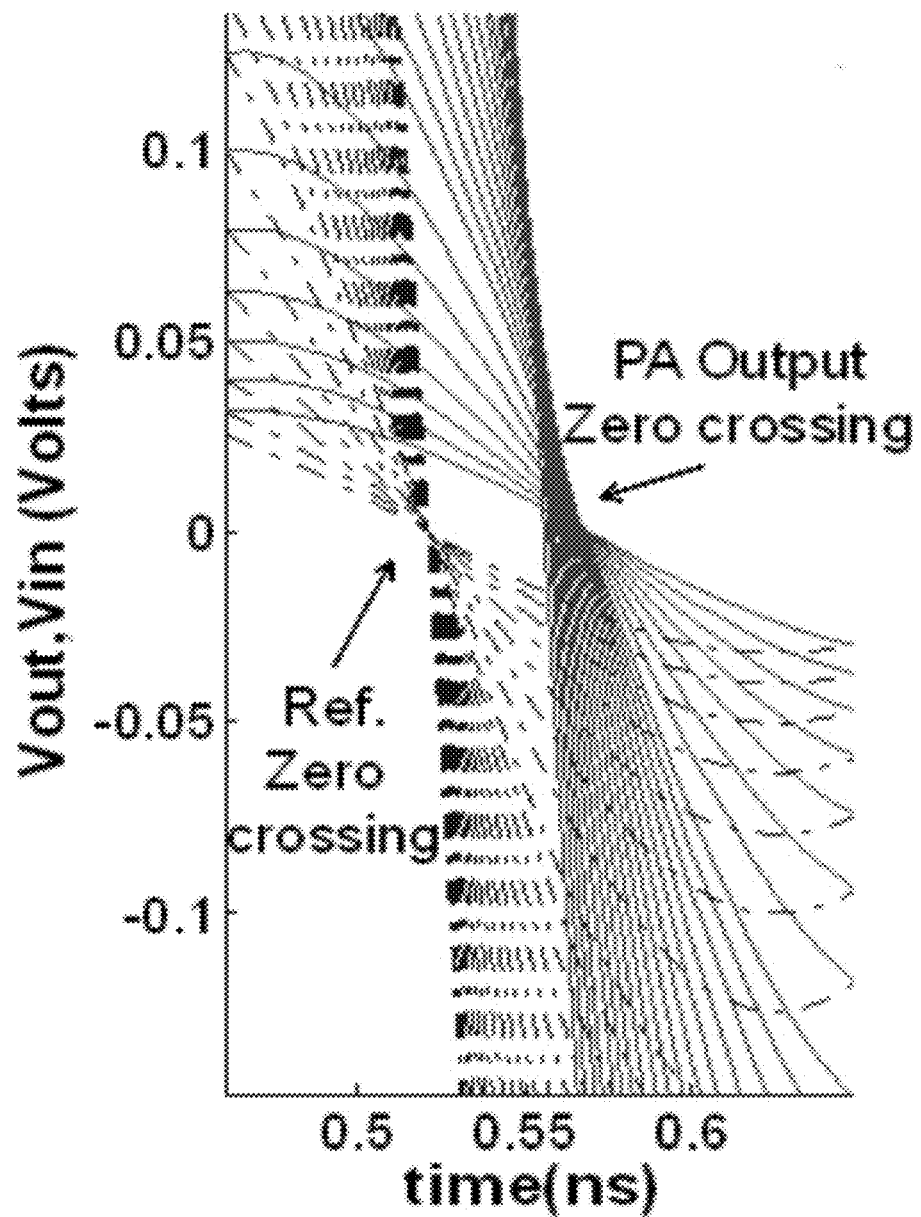
FIG. 6a provides an illustration of the graph from FIG. 5b which has been zoomed in at the zero crossing.

FIG. 6a provides an illustration of the graph from FIG. 5b which has been zoomed in at the zero crossing. As shown in FIG. 6a, zero crossing of the reference remains same for all input powers as expected from an exemplary embodiment of the amplifier distortion measurement system 200. In accordance with an exemplary embodiment of the amplifier distortion measurement system 200, the difference in zero crossing values is equivalent to the phase difference between the two waves. The changing zero crossing shown in FIG. 6a of the equalized output signal from a variable attenuator 212 of an exemplary embodiment of the amplifier distortion measurement system 200 reflects the actual phase distortion occurring in the PA 206 as amplitude increases in the reference input signal. Therefore, FIG. 6a illustrates that phase distortion is present in the equalized output signal before difference generation, and can be calculated by an exemplary embodiment of the amplifier distortion measurement system 200 to reflect in the difference signal $V_{diff}$.

Figure 6C:
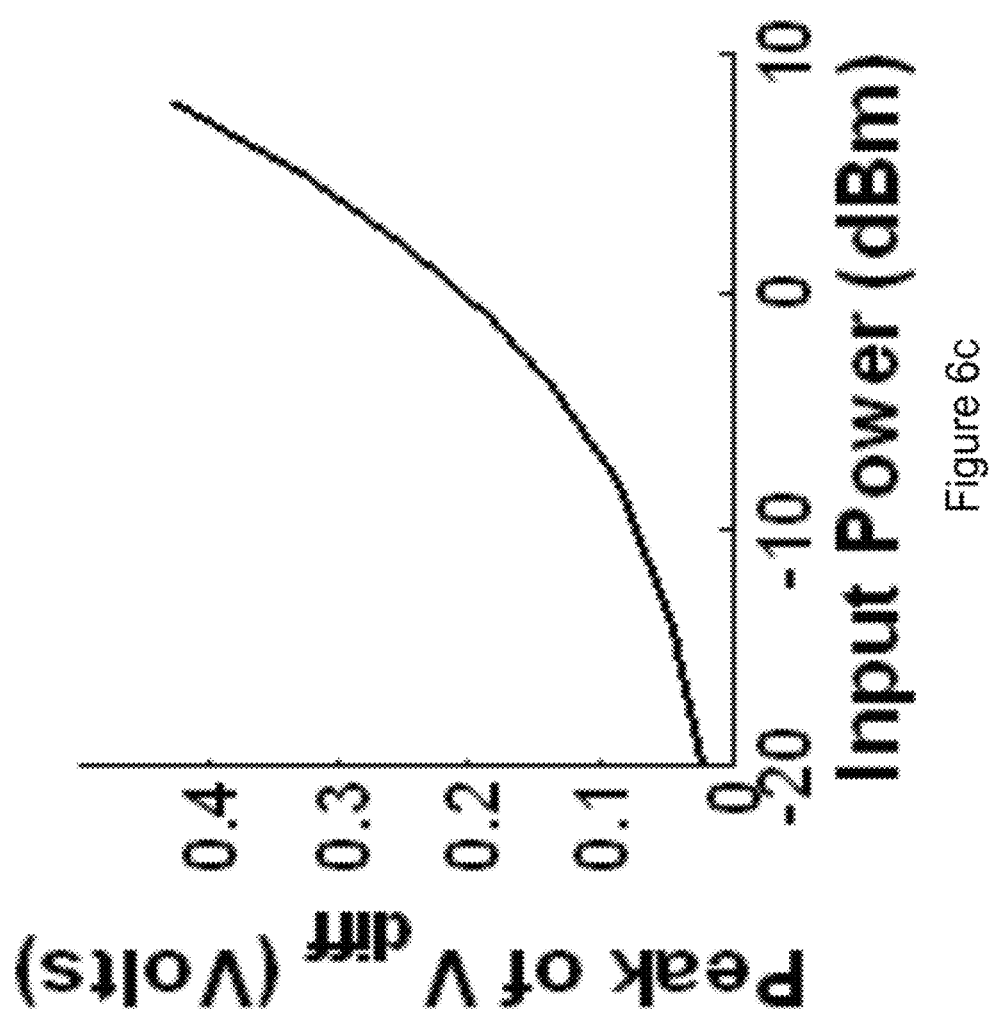
FIG. 6c illustrates the output of the peak detector 216, $|V_{diff}|$, for increasing input power levels in an exemplary embodiment of the amplifier distortion measurement system 200.

FIGS. 6b and 6c illustrate the output of the difference generator 216, $V_{diff}$, and the output of the peak detector 216, $|V_{diff}|$, respectively, for increasing input power levels in an exemplary embodiment of the amplifier distortion measurement system 200. In FIG. 5b, the original two signals are $\cos(\omega t)$ and $\cos(\omega t+\emptyset)$ with $\emptyset$ negative. The difference signal created by an exemplary embodiment of the amplifier distortion measurement system 200 shown in FIG. 6b is $\sin(\omega t+\emptyset/2)$, following Equation (1). The amplitude of this difference signal from an exemplary embodiment of the amplifier distortion measurement system 200 is given by Equation (3).

Figure 7:
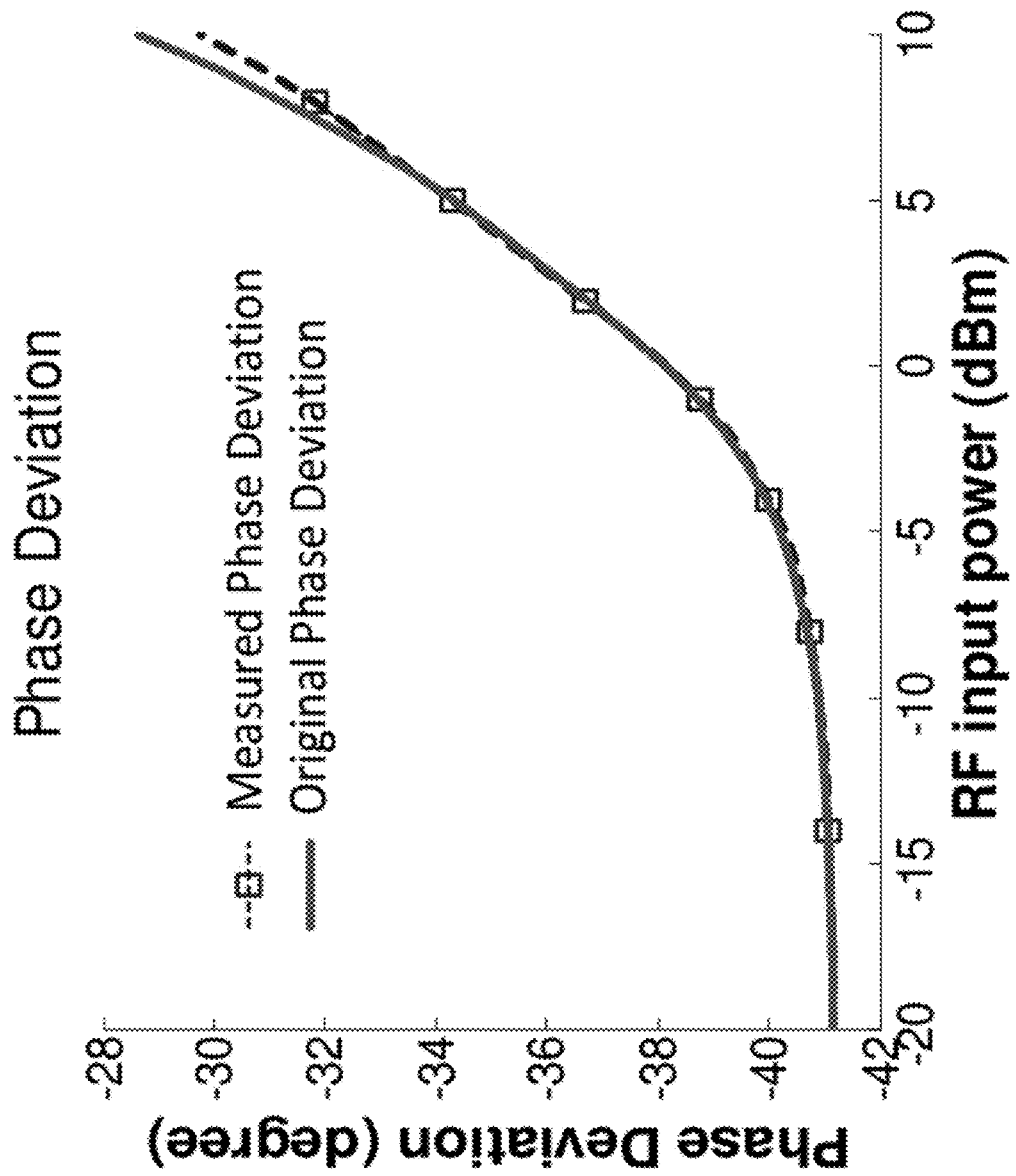
FIG. 7 provides a plot of the actual AM-PM distortion values for comparison purposes.

The exemplary embodiment of the amplifier distortion measurement system 200 can execute Equation (4), to provide the set of AM-PM distortion values plotted in FIG. 7. Additionally, FIG. 7 provides a plot of the actual AM-PM distortion values for comparison purposes. The set of AM-PM distortion values measured by the exemplary embodiment of the amplifier distortion measurement system 200 graphed in FIG. 7 have an rms error of only 0.18% over the total input power range.

Figure 8A:
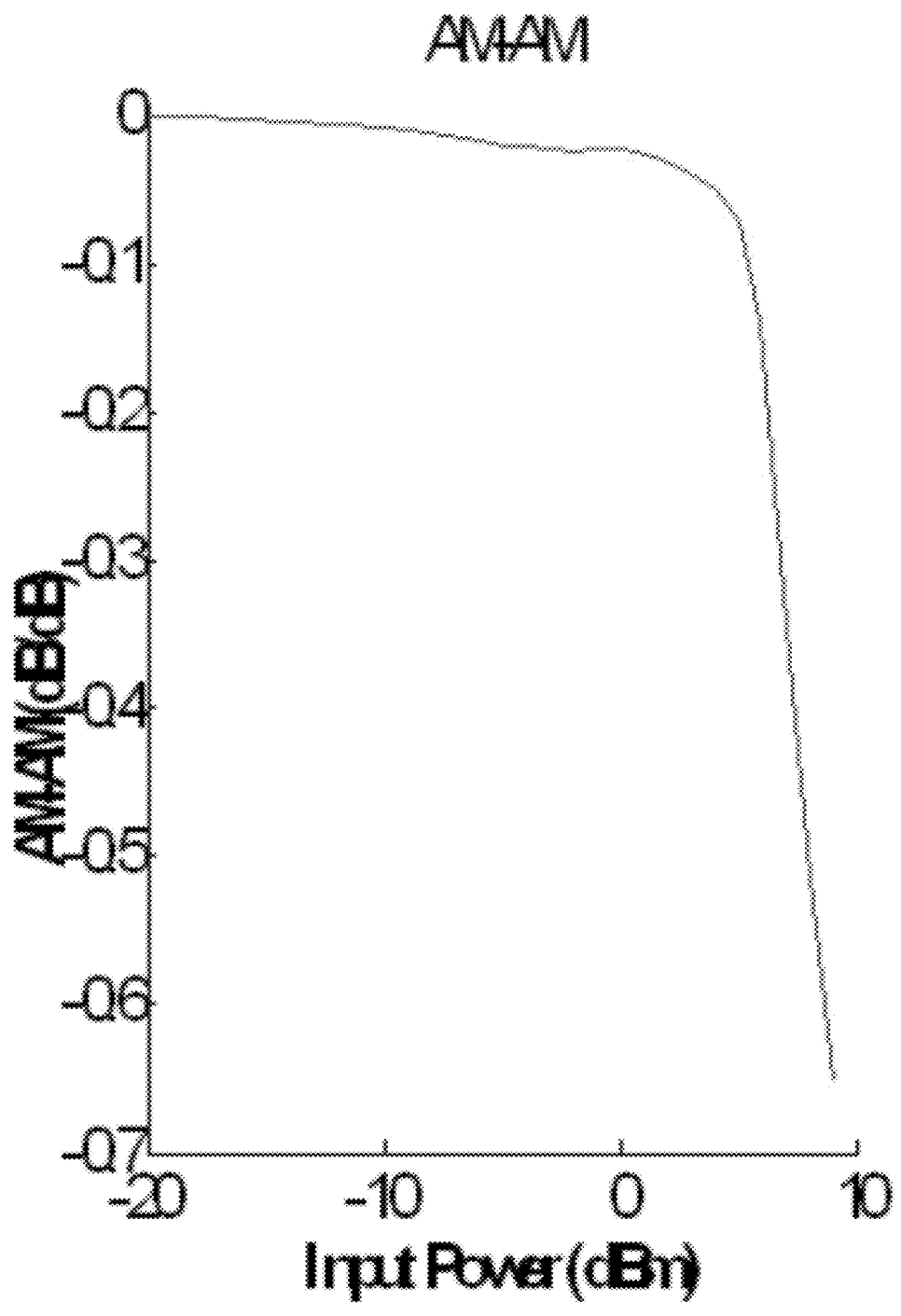
FIG. 8a provides a plot of the set of AM-AM distortion values measured by an exemplary embodiment of the amplifier distortion measurement system 200.
Figure 8B:
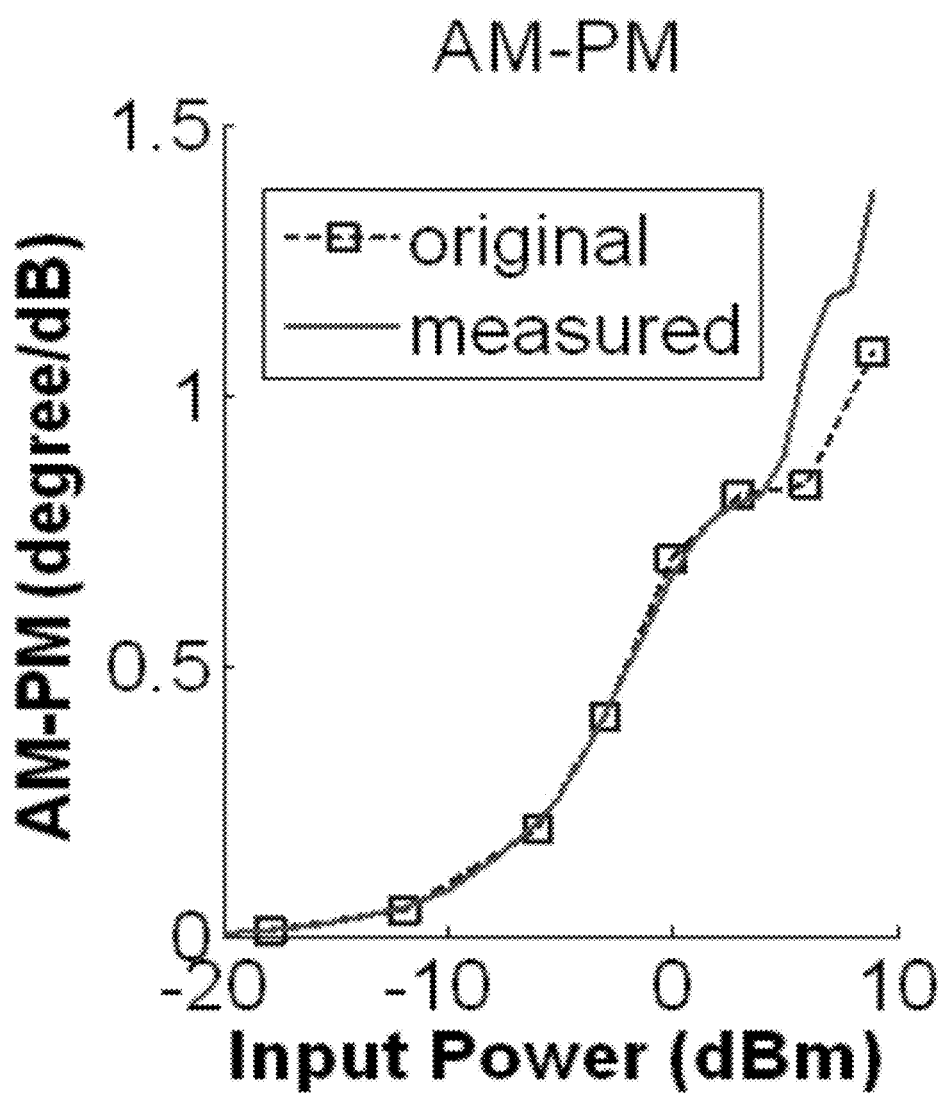
FIG. 8b provides a plot of the set of AM-PM distortion values measured by an exemplary embodiment of the amplifier distortion measurement system 200.

The set of AM-AM distortion values and the set of AM-PM distortion values measured by an exemplary embodiment of the amplifier distortion measurement system 200 are plotted in FIGS. 8a and 8b, respectively. The AM-PM distortion values from an exemplary embodiment of the amplifier distortion measurement system 200 plotted in FIG. 8b provide an rms error of only 5.8%.

An exemplary embodiment of the amplifier distortion measurement system 200 provides a difference generator 216 that generates the difference between the equalized output signal and the reference input signal of identical frequency. An exemplary embodiment of the amplifier distortion measurement system 200 provides the following properties: (1) the output is proportional to the difference of the two input signals; (2) the difference generator should preferably have wide bandwidth as both inputs and outputs are of RF frequency; (3) and the difference generator should be as linear as possible for the input range concerned.

Figure 9:
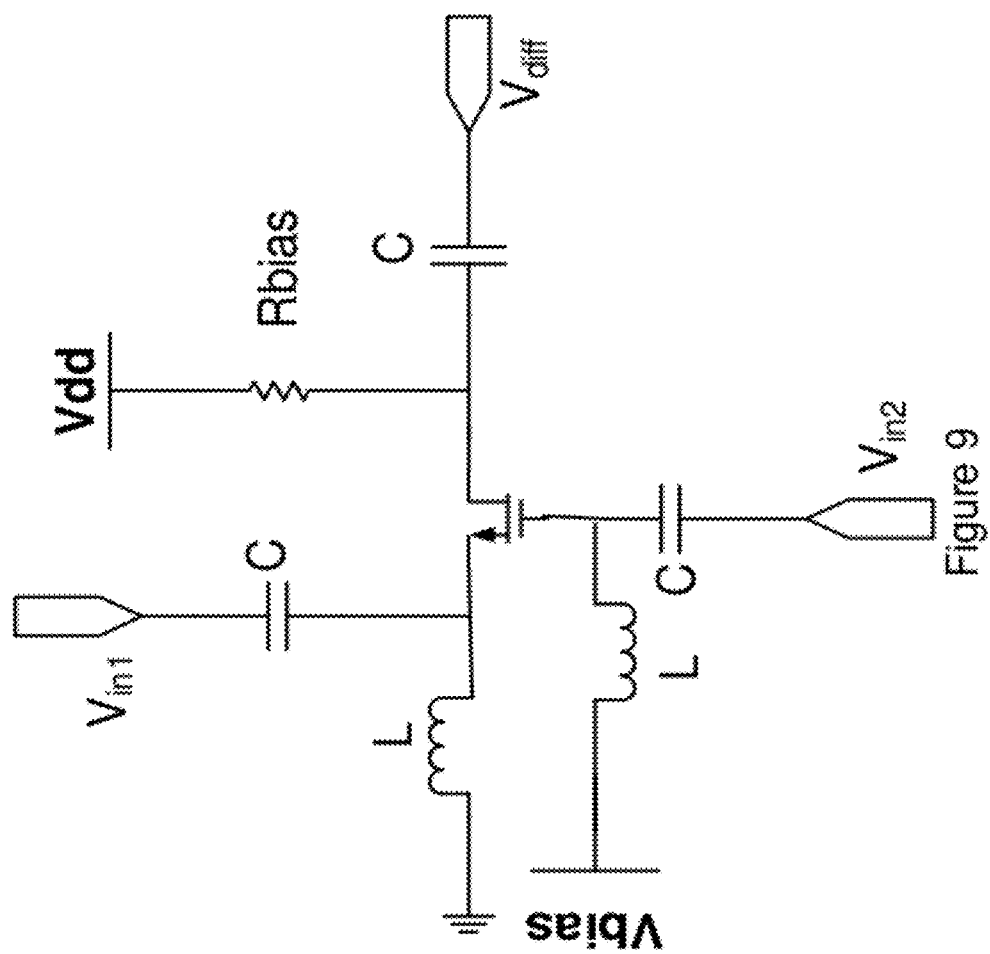
FIG. 9 provides a schematic of a difference generator 216 in accordance with an exemplary embodiment of the present invention.

FIG. 9 provides a schematic of a difference generator 216 in accordance with an exemplary embodiment of the present invention. A resistive loaded common source amplifier is used for an exemplary embodiment of the difference generator 216. DC biasing can be provided in an exemplary embodiment of the difference generator 216 through inductors (L) at both gate and source, whereas the RF input signals are AC coupled through capacitors (C). $R_{bias}$ can set the current through an exemplary embodiment of the difference generator 216, as well as the gain. The AC coupled output of an exemplary embodiment of the difference generator 216 can be equal to $V_{diff}$ as per Equation (1), if the inputs are given by $V_{in1}=A\sin(\omega t)$ and $V_{in2}=A\sin(\omega t+\emptyset)$. The gain (G) of an exemplary embodiment of the difference generator 216 can add a scaling factor to $V_{diff}$ which is accounted for by modifying (4) as $$\emptyset=\sin^{-1}(|V_{diff}|/2AG) \qquad (5)$$

The RF input port ($V_{in1}$) of an exemplary embodiment of the difference generator 216 can be matched to 50 ohm to match the PA output impedance. The other input port ($V_{in2}$) of an exemplary embodiment of a difference generator 216 can be a high impedance input which samples the signal from a 50 ohm termination on the reference signal path.

Figure 10:
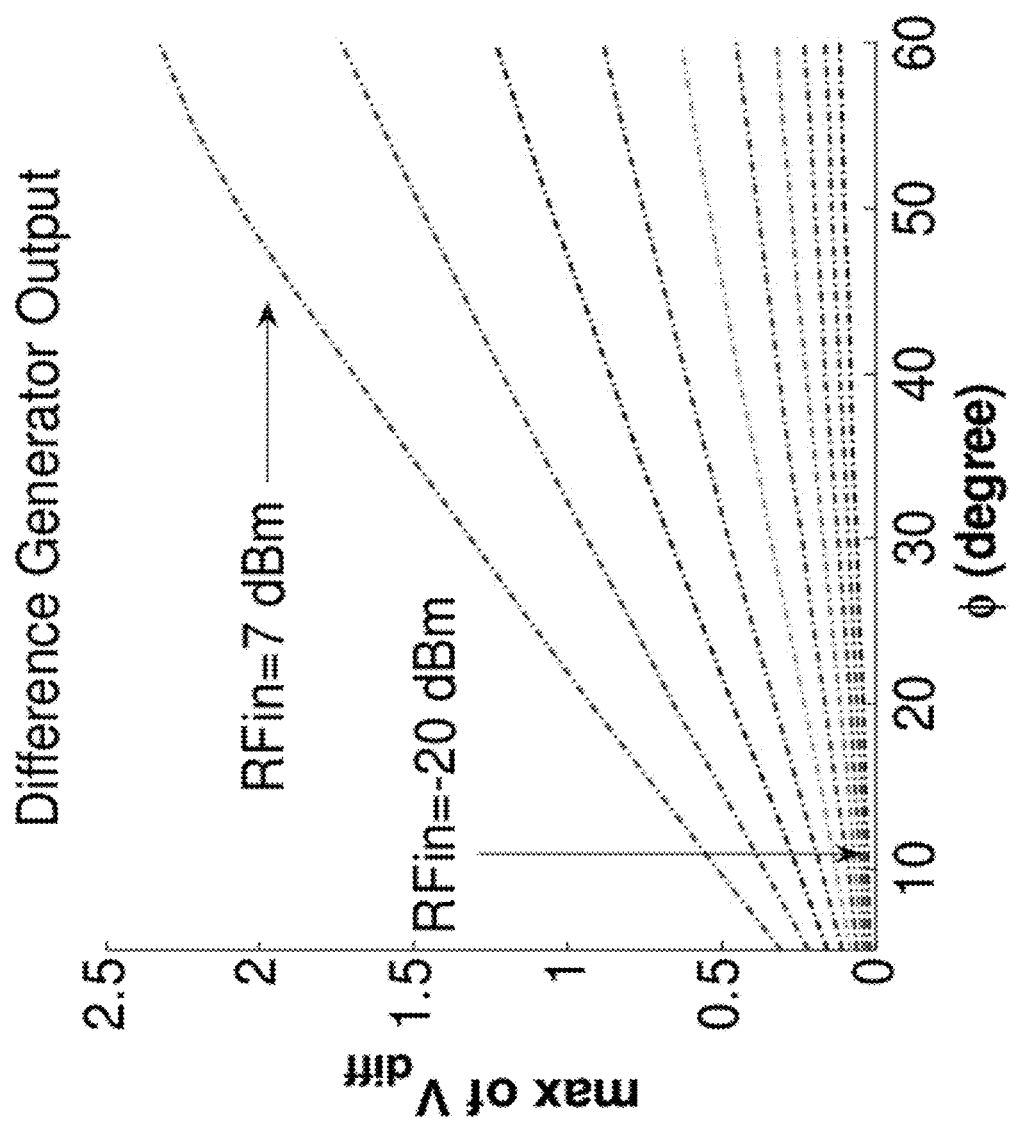
FIG. 10 provides an illustration of the output voltage of an exemplary embodiment of the peak detector 218 is proportional to the phase difference between the two inputs to the difference generator 216.

FIG. 10 provides an illustration of the output voltage of an exemplary embodiment of the peak detector 218, which is proportional to the phase difference between the two inputs to the difference generator 216. FIG. 10 shows $|V_{dif}|$ with Ø for several values of the input power as calculated by an exemplary embodiment of the amplifier distortion measurement system 200. FIG. 10 also illustrates that an exemplary embodiment of amplifier distortion measurement system 200 behaves very linearly from RF power levels from −20 dBm to 7 dBm for phase shifts up to even 60 degrees. For smaller phase shift values, the exemplary embodiment of the amplifier distortion measurement system 200 shows the output is linear even at higher input power levels.

Figure 11:
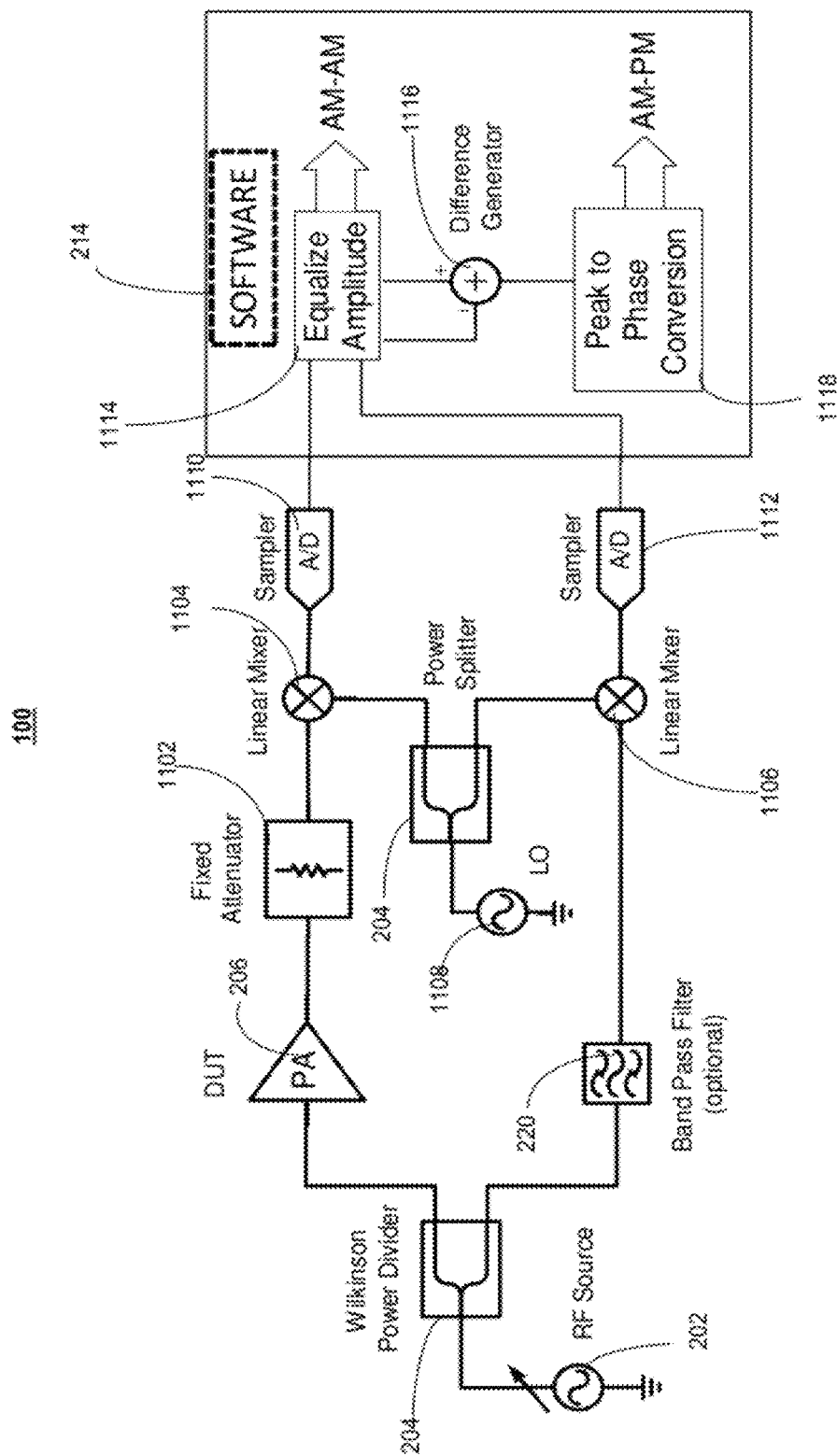
FIG. 11 provides an illustration of alternative embodiment of the amplifier distortion measurement system 200 that does not include a high frequency difference generator or a variable attenuator.

FIG. 11 provides an illustration of alternative embodiment of the amplifier distortion measurement system 200 that does not include a high frequency difference generator or a variable attenuator. The alternative embodiment of the amplifier distortion measurement system 200 enables real time distortion measurement and can be incorporated into a System on a Chip ("SOC") to dynamically and accurately account for distortion present in a power amplifier. The alternative embodiment of the amplifier distortion measurement system 200 utilizes down conversion and sampling of the high frequency signals and performs the amplitude equalization and difference generation in software. The exemplary embodiment of the amplifier distortion measurement system 200 shown in FIG. 11 provides a variable output power RF source 202 to generate the input signal. The input signal can then be divided into two equal parts using a power divider 202 in an exemplary embodiment of the amplifier distortion measurement system 200, one of which is used as the input to PA 206 and the other provides the reference input signal. An optional band pass filter 220 can be used in an exemplary embodiment of the amplifier distortion measurement system 200 to increase the purity of the reference as described above. An exemplary embodiment of the amplifier distortion measurement system 200 provides a fixed attenuator 1102 with an attenuation equal to the nominal linear gain of the PA 206. The fixed attenuator 1102 enables both the output signal of PA 206 and the reference input signal to be at similar power levels, but does not remove AM-AM distortion effect from the attenuated output. An exemplary embodiment of the amplifier distortion measurement system 200 provides two matched linear down conversion mixers 1104 and 1106 are used to down convert both the attenuated output signal from the PA 206 and the reference input signal to relatively low frequency signals, such as 50 MHz signals. In an exemplary embodiment of the amplifier distortion measurement system 200, a single RF source 1108 is used as the Local Oscillator (LO) signal of both the mixers by dividing it using a power splitter (WPD) 204). Two matched analog-to-digital converters ("ADC"s) 1110 and 1112 can be used in an exemplary embodiment of the amplifier distortion measurement system 200 to sample these signals.

The alternative embodiment of amplifier distortion measurement system 200 is capable of executing an alternative embodiment of the method of amplifier distortion measurement 300. The alternative embodiment of the method of amplifier distortion measurement 300 involves equalizing the amplitude of the down converted output signal from the PA 206 and the reference input signal for the lowest input power level. At a lower input power, the PA 206 should not exhibit gain compression and the attenuator attenuates by the same amount (linear gain of a nominal PA 206); thus in an exemplary embodiment of the amplifier distortion measurement system 200, there should not be any sufficient amplitude difference between the two signals being compared. Any amplitude mismatch at this low input power level reflects the amplitude mismatch in both the signal paths (path of reference input signal and path of the output signal from the PA 206) arising from the presence of a non-nominal PA 206, non exact attenuation, non-matched mixers and ADCs. In a majority of embodiments, this mismatch is constant across all power levels and hence, if any mismatch exist, all the down converted output signals from the PA 206 should be equalized for the respective amount of power gain or loss. Thereby removing any amplitude mismatch arising from all effects except gain compression. After this step of an exemplary embodiment of the method of amplifier distortion measurement 300, the signals corresponding to lower input power levels for which the PA does not exhibit gain compression can have equal or nearly equal amplitude, as well as the corresponding down converted signals for the same RF input signal power.

The alternative embodiment of the method of amplifier distortion measurement 300 involves equalizing the digital output signal and the digital reference input signal with an equalize amplitude module 1114. In accordance with the alternative embodiment of the method of amplifier distortion measurement 300, there are residual amplitude differences present between the digital output signal from ADC 1110 and the digital reference input signal from ADC 1112 for higher input power levels due to AM-AM distortion effects.

In the alternative embodiment of the amplifier distortion measurement system 200, the equalize amplitude module 1114 can digitally equalize the digital output signal with the digital reference input signal and as a by-product, the amount of the equalization at each power level corresponds to the gain compression at that input power value. Therefore, the outputs of the equalize amplitude module 1114 of an alternative embodiment of the amplifier distortion measurement system 200 are (1) two signals with sufficiently matched amplitudes (phase difference still preserved) and (2) a set of AM-AM distortion values for the PA 206 over all input power levels. In an alternative embodiment of the amplifier distortion measurement system 200, the gain of the PA 206 can be written as: Gain of PA=Attenuation of fixed attenuator (linear gain of nominal PA)+power equalization amount (dBs, gain difference due to non-nominal PA, constant over all power levels)+ power equalization by the equalize amplitude module 1114 (dBs, different for different power levels in the compression region).

Next, the alternative embodiment of the amplifier distortion measurement system 200 can provide a difference generator module 1116 to compare the difference between the equalized digital output signal and the digital reference input signal. In the alternative embodiment of the amplifier distortion measurement system 200, the difference generator module 1116 can create a difference signal, $V_{diff}$, for which the amplitude is proportional to the phase difference of the two input signals. The alternative embodiment of the amplifier distortion measurement system 200 further includes a peak-to-phase conversion module 1118 that applies Equation (4) to calculate a set of AM-PM distortion values between the signals being compared at all input power levels. The alternative embodiment of the method of amplifier distortion measurement 300 relies upon the fact that phase deviation is preserved by frequency translation and provides accurate phase information as long as the mixers 1104 and 1106 are operating in the linear range of input power concerned. In some embodiments, an issue can be created by the amount of attenuation to be programmed in the "fixed" attenuator, but this can be solved by setting the attenuation to be the same as the linear expected gain of the PA 206 (in dBs). In embodiments where the attenuation is not exact, the equalize amplitude module 1114 can compensate for any subsequent amplitude mismatch effects. In some embodiments, the fixed attenuator 1102 attempts to ensure that both the signals being compared are in the same power range so that the dynamic range requirements of components of devices in both the reference signal and PA 206 signal paths are the same and hence, matched mixers and ADCs can be used.

Figure 12:
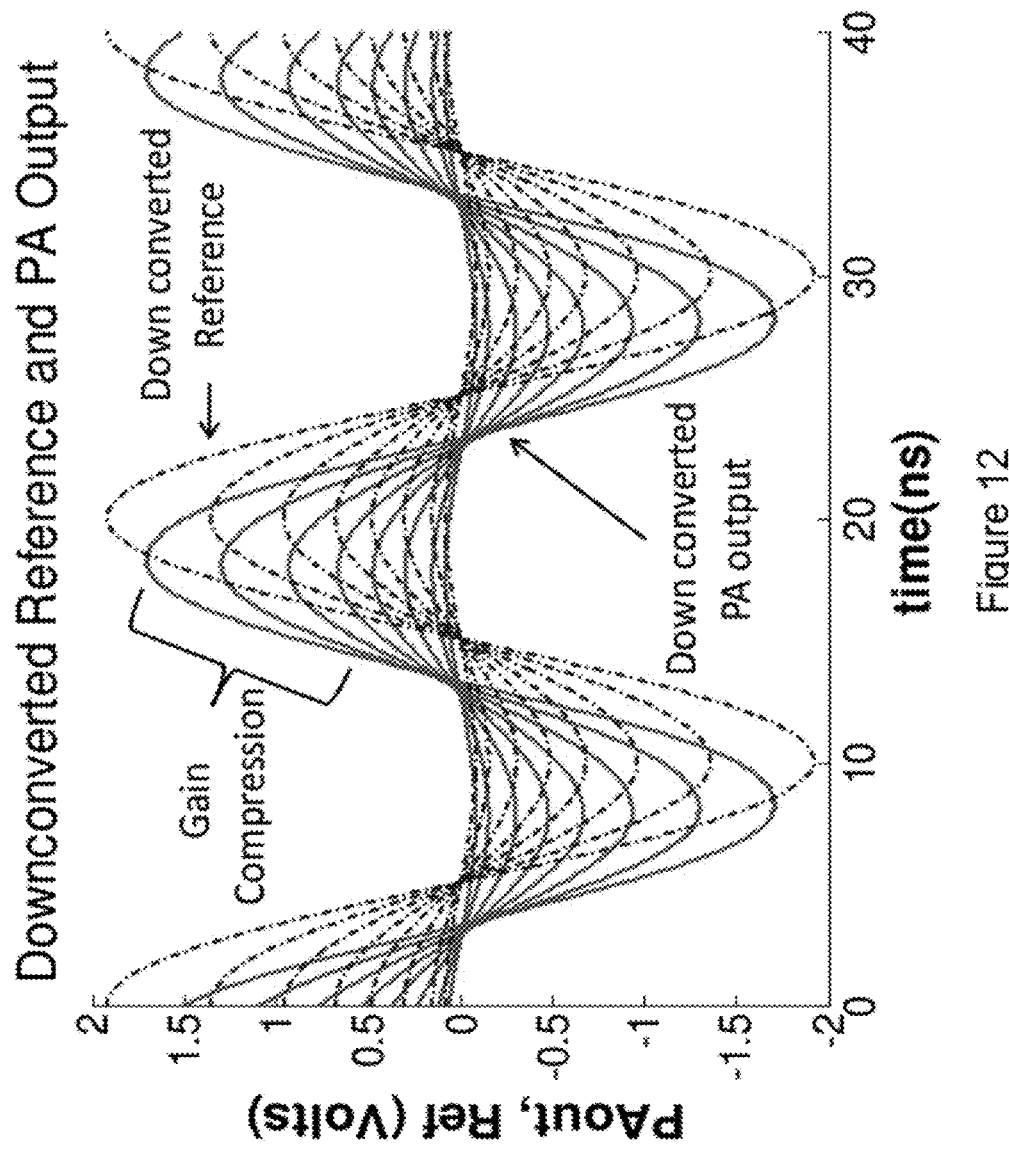
FIG. 12 illustrates the down converted reference input signal and the output signal of the PA 206 in accordance with an alternative embodiment of the amplifier distortion measurement system 200.
Figure 13:
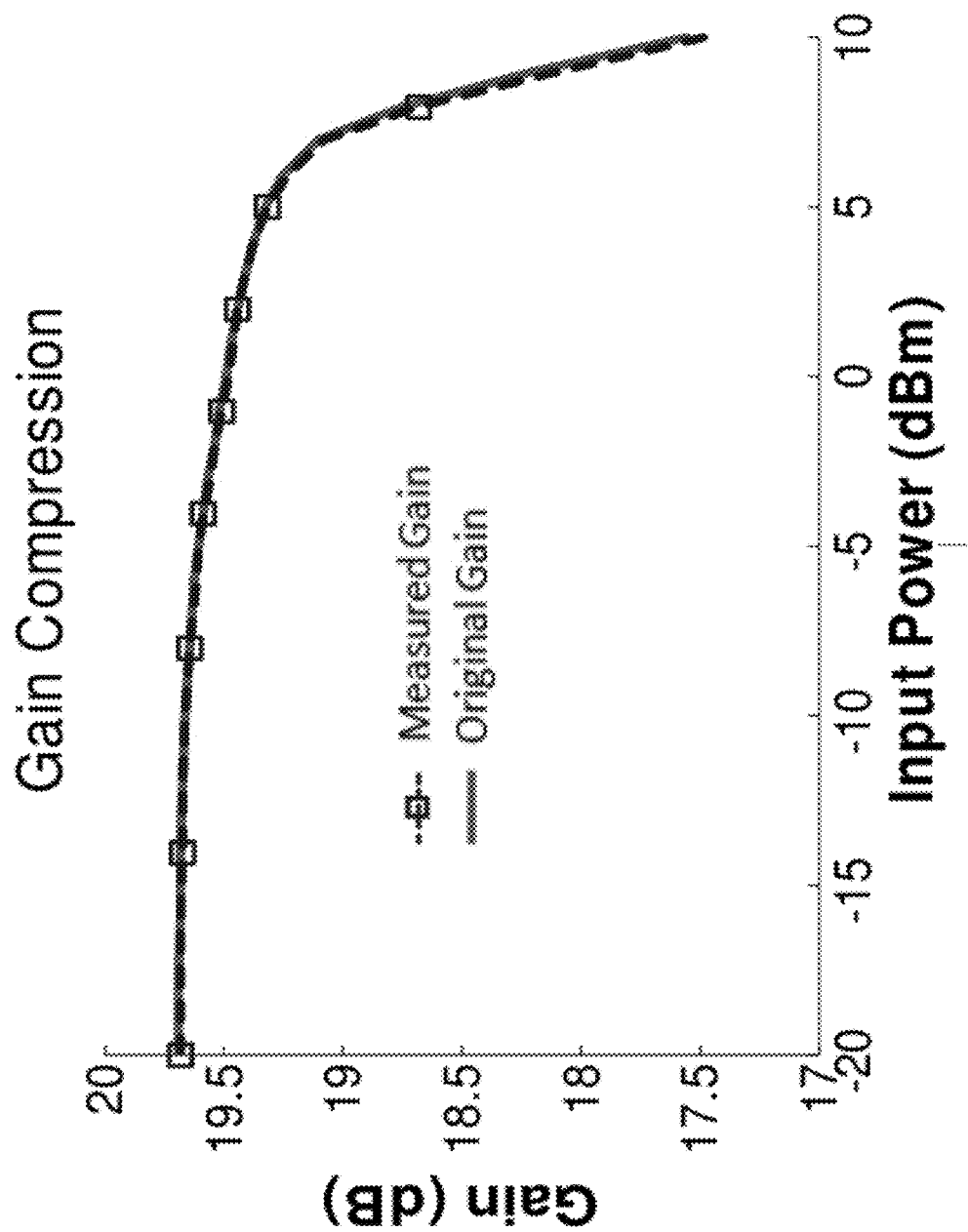
FIG. 13 provides a plot of the measured gain values versus the original gain over the input power range.
Figure 14:
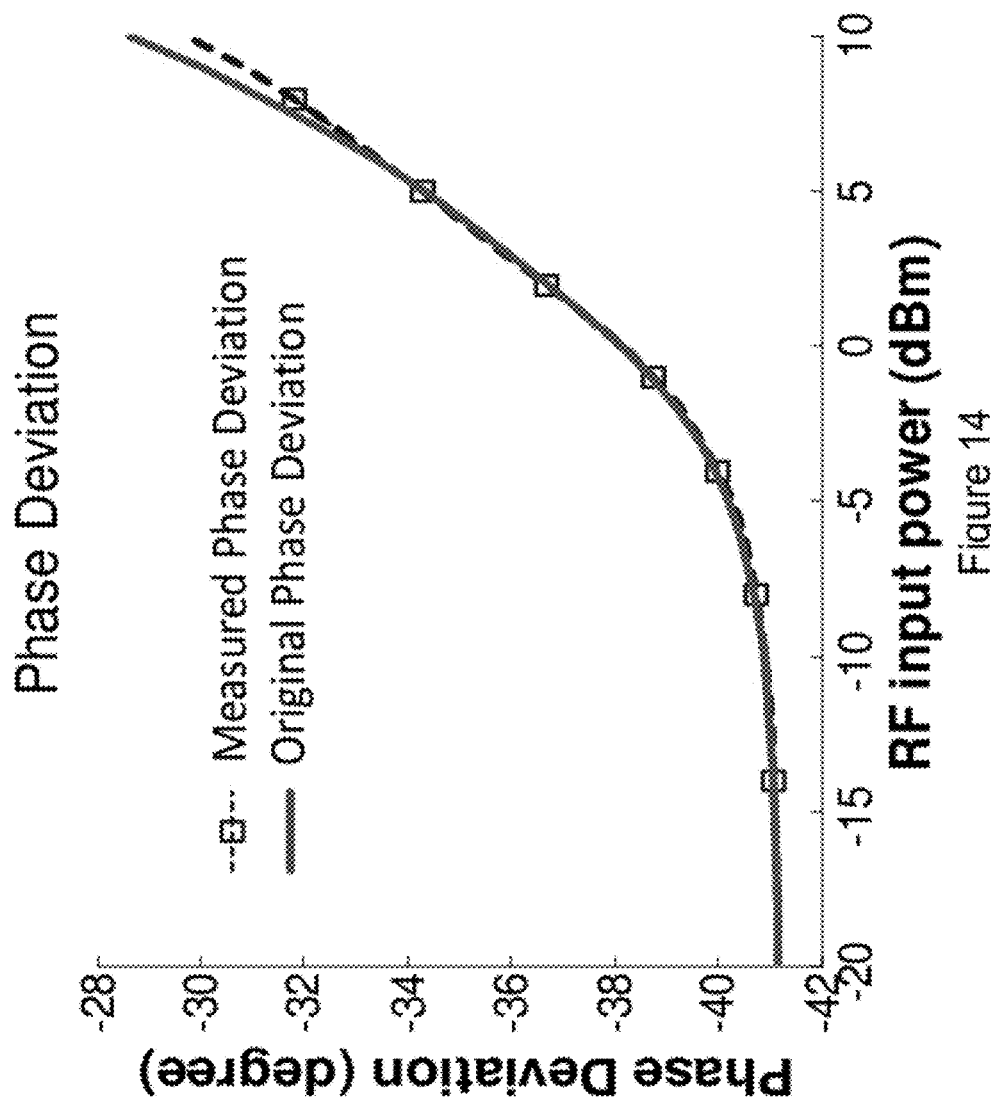
FIG. 14 provide a plot of the a set of AM-PM distortion values of an alternative embodiment of the amplifier distortion measurement system 200.

FIG. 12 illustrates the down converted reference input signal and the output signal of the PA 206 in accordance with an alternative embodiment of the amplifier distortion measurement system 200. As shown in the alternative embodiment of the amplifier distortion measurement system 200 used to generate the plots in FIG. 12, the down converted signals have a frequency of 50 MHz. The plots shown in FIG. 12 illustrate the signals output from the equalize amplitude module 1114. In one embodiment, the output signal has same amplitude as the reference input signal for lower power levels, whereas, for higher powers it exhibits gain compression. Therefore, the equalize amplitude module 1114 of an alternative embodiment of the amplifier distortion measurement system 200 can provide for the ability to measure a set of AM-AM distortion values. For example, the in an alternative embodiment of the method of amplifier distortion measurement 300 the gain values are measured using Equation (5). FIG. 13 provides a plot of the measured gain values versus the original gain over the input power range. As shown in FIG. 13, the alternative embodiment of the amplifier distortion measurement system 200 can accurately measure gain, with only 0.03% rms error over all power levels. The alternative embodiment of the method of amplifier distortion measurement 300 further provides the difference generator module 1116 and the peak-to-phase conversion module 1118 to calculate a set of AM-PM distortion values, providing the original phase deviation, using Equations (3) and (4). As shown in FIG. 14, the alternative embodiment of the amplifier distortion measurement system 200 can calculate a set of AM-PM distortion values with an rms error of 0.22%.

Figure 15A:
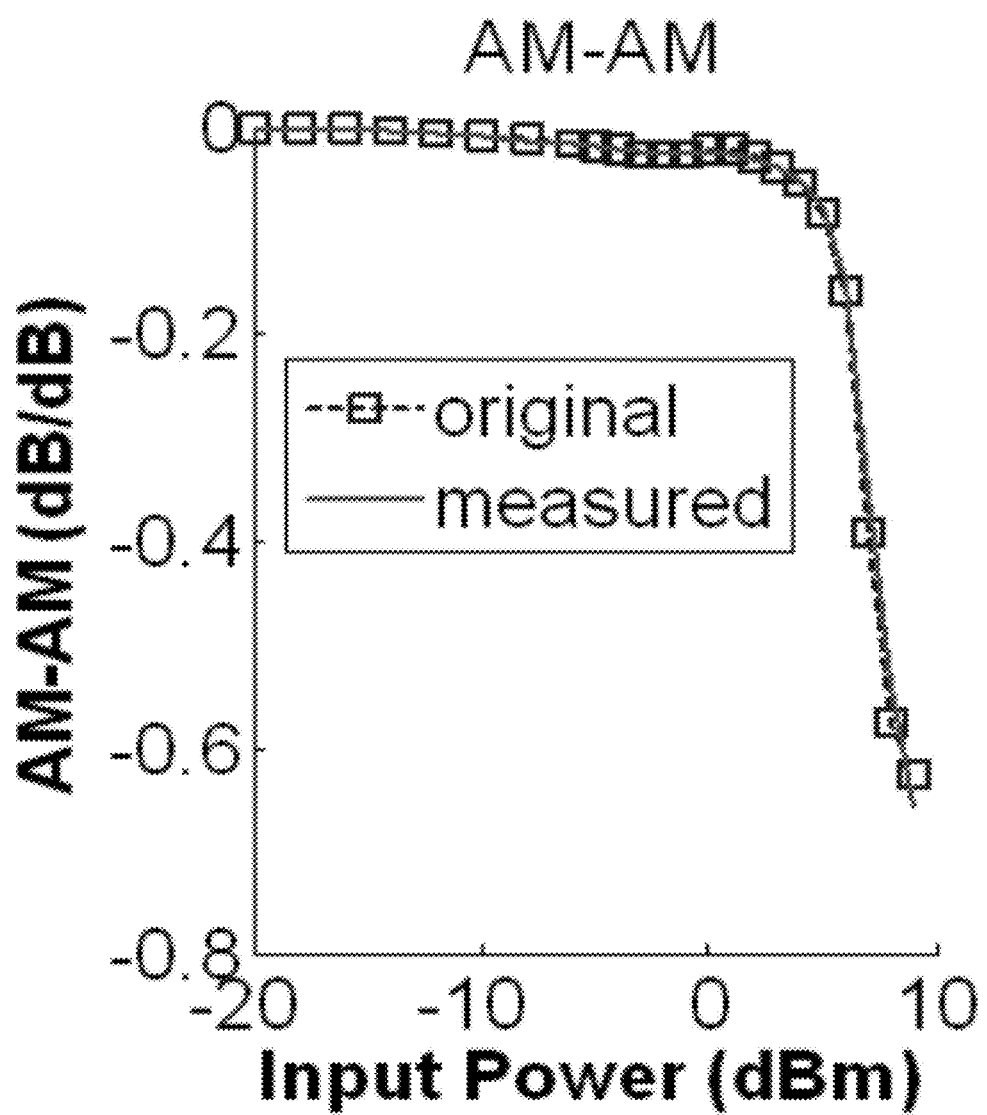
FIG. 15a provides a plot of the set of AM-AM distortion values measured by the alternative embodiment of the amplifier distortion measurement system 200.
Figure 15B:
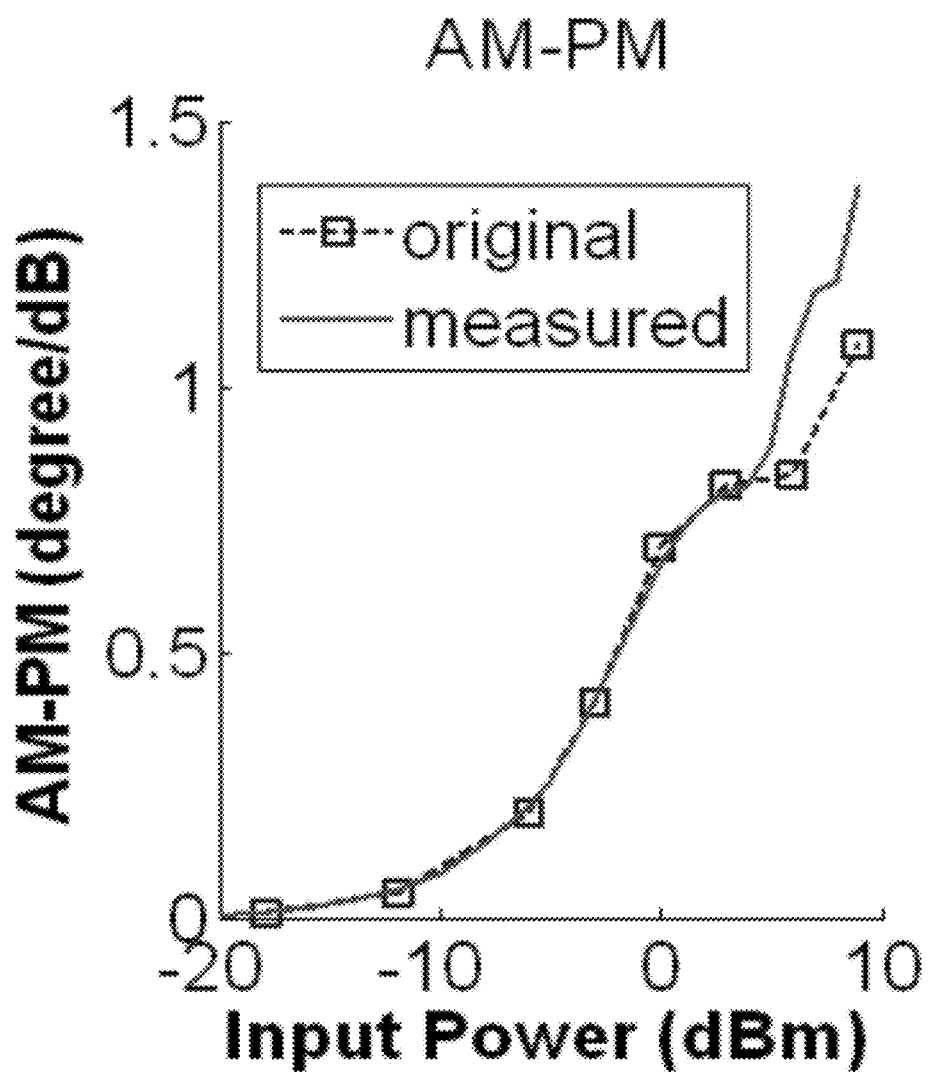
FIG. 15b provides a plot of the set of AM-PM distortion values measured by the alternative embodiment of the amplifier distortion measurement system 200.

FIG. 15a provides a plot of the set of AM-AM distortion values measured by the alternative embodiment of the amplifier distortion measurement system 200. As shown in FIG. 15a, the alternative embodiment of the amplifier distortion measurement system 200 can calculate a set of AM-AM distortion values with an rms error of 1%. FIG. 15b provides a plot of the set of AM-PM distortion values measured by the alternative embodiment of the amplifier distortion measurement system 200. As shown in FIG. 15b, the alternative embodiment of the amplifier distortion measurement system 200 can calculate a set of AM-PM distortion values with an rms error of 4.74%.

The various systems, methods, and techniques described herein may be implemented with hardware or software or, where appropriate, with a combination of both. Thus, the methods and apparatus of the present invention, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computer will generally include a processor, a storage medium readable by the processor (including volatile and non-volatile memory and/or storage elements), at least one input device, and at least one output device. One or more programs are preferably implemented in a high level procedural or object oriented programming language to communicate with a computer system. However, the program(s) can be implemented in assembly or machine language, if desired. In any case, the language may be a compiled or interpreted language, and combined with hardware implementations.

The methods and apparatus of the present invention may also be embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, a video recorder or the like, the machine becomes an apparatus for practicing the invention. When implemented on a general-purpose processor, the program code combines with the processor to provide a unique apparatus that operates to perform the functionality of the present invention.

While the present invention has been described in connection with the preferred embodiments of the various figures, it is to be understood that other similar embodiments may be used or modifications and additions may be made to the described embodiments for performing the same functions of the present invention without deviating therefrom. Therefore, the present invention should not be limited to any single embodiment, but rather construed in breadth and scope in accordance with the appended claims.

What is claimed is:

1. A method for amplifier distortion measurement, the method comprising:
    comparing a first amplitude response of an output signal from a power amplifier to a second amplitude response of a reference input signal to determine a set of Amplitude-to-Amplitude ("AM-AM") distortion values;
    equalizing the first amplitude response of the output signal to match the second amplitude response of the reference input signal based on the set of AM-AM distortion values;
    creating a difference signal based on a comparison of the equalized output signal to the reference input signal; and
    calculating a set of Amplitude-to-Phase ("AM-PM") distortion values based on a third amplitude response of the difference signal.

2. The method for amplifier distortion measurement of claim 1, wherein an equalize amplitude module equalizes the first amplitude response of the output signal to match the second amplitude response of the reference input signal.

3. The method for amplifier distortion measurement of claim 2, wherein an equalize amplitude module removes the AM-AM distortion effects from the output signal.

4. The method for amplifier distortion measurement of claim 1, wherein a difference generator module creates the difference signal based on the comparison of the equalized output signal to the reference input signal.

5. The method for amplifier distortion measurement of claim 1, wherein a peak-to-phase conversion module calculates the set of AM-PM distortion values based on the third amplitude response of the difference signal.

6. The method for amplifier distortion measurement of claim 1, wherein a power detector compares the first amplitude response of the output signal from the power amplifier to the second amplitude response of the reference input signal.

7. The method for amplifier distortion measurement of claim 1, wherein a control module drives a variable attenuator to equalize the first amplitude response of the output signal to match the second amplitude response of the reference input signal.

8. The method for amplifier distortion measurement of claim 1, wherein a variable attenuator removes the AM-AM distortion effects from the output signal.

9. The method for amplifier distortion measurement of claim 1, wherein a difference generator creates the difference signal based on the comparison of the equalized output signal to the reference input signal.

10. The method for amplifier distortion measurement of claim 1, wherein a peak detector calculates the third amplitude response of the difference signal.

11. An amplifier distortion measurement system comprising:
   a power amplifier receiving a reference input signal and providing an output signal;
   a power detector in communication with an output of the power amplifier enabled to create a set of Amplitude-to-Amplitude ("AM-AM") distortion values based on the difference between the output signal and the reference input signal;
   a control module enabled to drive a variable attenuator in communication with an output of the power amplifier to create a equalized output signal to match the second amplitude response of the reference input signal based on the set of AM-AM distortion values;
   a difference generator enabled to create a difference signal based on a comparison of the equalized output signal to the reference input signal; and
   a peak-to-phase conversion module enabled to calculate a set of Amplitude-to-Phase ("AM-PM") distortion values based on a third amplitude response of the difference signal.

12. The amplifier distortion measurement system of claim 11, wherein the variable attenuator removes the AM-AM distortion effects from the output signal.

13. The amplifier distortion measurement system of claim 12, wherein equalized output signal created by the variable attenuator equalizes the output signal and the reference input signal for a plurality of input power levels provided by the reference input signal.

14. The amplifier distortion measurement system of claim 13, wherein the peak detector is enabled to measure the peak values of the difference signal.

15. The amplifier distortion measurement system of claim 11, wherein the peak-to-phase conversion module is enabled to calculate the set of Amplitude-to-Phase ("AM-PM") distortion values from the peak values of the difference signal.

16. An amplifier distortion measurement system comprising:
   a power amplifier receiving a reference input signal and providing an output signal;
   a memory to store and microprocessor to execute an equalize amplitude module, a difference generator module, and a peak-to-phase conversion module;
   a fixed attenuator in communication with an output of the power amplifier enabled to create an attenuated output signal;
   a first linear mixer in communication with fixed attenuator to receive the attenuated output signal and output a down converted output signal;
   a first Analog-to-Digital Convertor ("ADC") to receive the down converted output signal and create a digital output signal;
   a second linear mixer to receive the reference input signal and output a down converted reference input signal;
   a second Analog-to-Digital Convertor ("ADC") to receive the down converted reference input signal and create a digital reference input signal; and
   wherein the equalize amplitude module is enabled to equalize the digital output signal to match the amplitude of the digital reference input signal and create a set of Amplitude-to-Amplitude ("AM-AM") distortion values based on the difference between the digital output signal and the digital reference input signal;
   wherein the difference generator module is enabled to create a difference signal based on a comparison of the equalized digital output signal to the digital reference input signal; and
   wherein the peak-to-phase conversion module is enabled to calculate a set of Amplitude-to-Phase ("AM-PM") distortion values based on an amplitude of the difference signal.

17. The amplifier distortion measurement system of claim 16, wherein an equalize amplitude module equalizes the amplitude of the digital output signal to match the amplitude of the digital reference input signal.

18. The amplifier distortion measurement system of claim 16, wherein an equalize amplitude module removes the AM-AM distortion effects from the digital output signal.

19. The amplifier distortion measurement system of claim 16, wherein a difference generator module creates the difference signal based on the comparison of the equalized digital output signal to the digital reference input signal.

20. The amplifier distortion measurement system of claim 16, wherein a peak-to-phase conversion module measures a plurality of peak amplitudes of the difference signal.

* * * * *